US012620563B2

(12) United States Patent
Hirayama

(10) Patent No.: US 12,620,563 B2
(45) Date of Patent: *May 5, 2026

(54) PLASMA PROCESSING APPARATUS AND PLASMA PROCESSING METHOD

(71) Applicants: Tokyo Electron Limited, Tokyo (JP); Tohoku University, Miyagi (JP)

(72) Inventor: Masaki Hirayama, Tokyo (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 1257 days.

This patent is subject to a terminal disclaimer.

(21) Appl. No.: 17/299,626

(22) PCT Filed: Nov. 26, 2019

(86) PCT No.: PCT/JP2019/046237

§ 371 (c)(1),
(2) Date: Jun. 3, 2021

(87) PCT Pub. No.: WO2020/116258

PCT Pub. Date: Jun. 11, 2020

(65) Prior Publication Data

US 2022/0020574 A1     Jan. 20, 2022

(30) Foreign Application Priority Data

Dec. 6, 2018     (JP) ................................. 2018-229232

(51) Int. Cl.
*H01L 21/00*     (2006.01)
*H01J 37/32*     (2006.01)

(52) U.S. Cl.
CPC .. *H01J 37/32715* (2013.01); *H01J 37/32568* (2013.01); *H01J 2237/2007* (2013.01)

(58) Field of Classification Search
None
See application file for complete search history.

(56) References Cited

U.S. PATENT DOCUMENTS 4,342,901 A * 8/1982 Zajac ................ H01J 37/32623
                                                  204/298.31
5,820,947 A * 10/1998 Itoh ................... H01J 37/32541
                                                  427/535

(Continued)

FOREIGN PATENT DOCUMENTS

JP         2000269146 A      9/2000
JP         2000299198 A      10/2000

(Continued)

*Primary Examiner* — Sylvia MacArthur
*Assistant Examiner* — Michelle Crowell
(74) *Attorney, Agent, or Firm* — Nath, Goldberg & Meyer; Jerald L. Meyer; Tanya E. Harkins

(57) ABSTRACT

There is provided a technique capable of improving plasma uniformity in a parallel plate-type plasma processing apparatus having a plasma excitation frequency of a VHF band or an UHF band. A plasma processing apparatus according to an exemplary embodiment includes a process container, a stage provided in the process container, a dielectric plate provided above the upper surface of the stage via a space in the process container, and an upper electrode provided above the dielectric plate. An gap is provided between the upper electrode and the dielectric plate, and the width of the gap is non-uniform in a direction in which the dielectric plate extends.

17 Claims, 11 Drawing Sheets

(56) References Cited

U.S. PATENT DOCUMENTS

| | | | | |
|---|---|---|---|---|
| 5,904,487 | A * | 5/1999 | Conboy ............ | H01J 37/32541 |
| | | | | 438/719 |
| 5,997,686 | A * | 12/1999 | Lardon ................. | C23C 16/517 |
| | | | | 156/345.47 |
| 6,228,438 | B1 * | 5/2001 | Schmitt ............ | H01J 37/32532 |
| | | | | 427/535 |
| 8,382,941 | B2 * | 2/2013 | Harrington ....... | H01L 21/67069 |
| | | | | 156/345.43 |
| 11,854,772 | B2 * | 12/2023 | Hirayama ......... | H01J 37/32513 |
| 11,923,170 | B2 * | 3/2024 | Kawakami ........ | H01J 37/32568 |
| 12,087,552 | B2 * | 9/2024 | Hirayama ............... | H05H 1/46 |
| 2001/0026575 | A1 * | 10/2001 | Sato ......................... | H05B 7/00 |
| | | | | 373/18 |
| 2002/0104482 | A1 * | 8/2002 | Kazumi ............ | H01J 37/32082 |
| | | | | 118/500 |
| 2003/0089314 | A1 * | 5/2003 | Matsuki ............ | H01J 37/32009 |
| | | | | 118/715 |
| 2011/0162582 | A1 * | 7/2011 | Ellert ................ | H01J 37/32541 |
| | | | | 118/723 E |
| 2011/0162799 | A1 * | 7/2011 | Hayashi .............. | H01J 37/3255 |
| | | | | 156/345.43 |
| 2013/0292057 | A1 * | 11/2013 | Ramaswamy .... | H01J 37/32532 |
| | | | | 156/345.44 |
| 2014/0339981 | A1 * | 11/2014 | Komatsu ............ | H01J 37/3222 |
| | | | | 315/34 |
| 2022/0020569 | A1 * | 1/2022 | Hirayama ......... | H01J 37/32229 |

FOREIGN PATENT DOCUMENTS

| | | | |
|---|---|---|---|
| JP | 2003506889 A | 2/2003 |
| JP | 2003243376 A | 8/2003 |
| JP | 2014003179 A | 1/2014 |
| KR | 10-0792314 B1 | 1/2008 |

* cited by examiner

PLASMA PROCESSING APPARATUS AND PLASMA PROCESSING METHOD

This is a National Phase Application filed under 35 U.S.C. 371 as a national stage of PCT/JP2019/046237, filed Nov. 26, 2019, an application claiming the benefit of Japanese Application No. JP 2018-229232, filed Dec. 6, 2018, the content of each of which is hereby incorporated by reference in its entirety.

TECHNICAL FIELD

Exemplary embodiments of the present disclosure relate to a plasma processing apparatus and a plasma processing method.

BACKGROUND

A plasma processing apparatus is used to manufacture electronic devices. Patent Document 1 discloses a technique relating to a plasma processing apparatus. The plasma processing apparatus includes a vacuum container, a process chamber, a support electrode, an antenna and a radiation port, and a magnetic field forming means. The process chamber is provided inside the vacuum container and is supplied with a gas. The support electrode is provided in the process chamber and supports an object to be processed. The antenna and the radiation port supply the high frequency of a very high frequency (VHF) band or an ultra high frequency (UHF) band to the process chamber. The magnetic field forming means forms a magnetic field in the process chamber. The plasma processing apparatus includes an electric field control space. The electric field control space is composed of a dielectric and a metal partition plate or disc-shaped metal surrounding the dielectric. The VHF band is a frequency band in the range of about 30 to 300 [MHz]. The UHF band is a frequency band in the range of about 300 [MHz] to 3 [GHz].

PRIOR ART DOCUMENTS

Patent Documents

Patent Document 1: Japanese laid-open publication No. 2003-243376

The present disclosure provides some embodiments of a technique capable of improving plasma uniformity in a parallel plate-type plasma processing apparatus having a plasma excitation frequency of a VHF band or an UHF band.

SUMMARY

According to an exemplary embodiment, there is provided a plasma processing apparatus. The plasma processing apparatus includes a process container, a stage, a dielectric plate, an upper electrode, a waveguide, and an end portion of the waveguide. The stage is provided in the process container. The dielectric plate is provided above the upper surface of the stage via a space in the process container. The upper electrode is provided above the dielectric plate. The waveguide guides a high frequency of a VHF band or an UHF band. The end portion of the waveguide is located toward the space and radiates a high frequency into the space. An gap is provided between the upper electrode and the dielectric plate. The width of the gap is non-uniform in a direction in which the dielectric plate extends.

According to the present disclosure, it is possible to provide a technique capable of improving plasma uniformity in a parallel plate-type plasma processing apparatus having a plasma excitation frequency of a VHF band or an UHF band.

BRIEF DESCRIPTION OF DRAWINGS

FIG. 4 is a view illustrating in more detail a portion of the configuration illustrated in FIGS. 2 and 3.

FIG. 11 is a view illustrating a stage according to another exemplary embodiment.

DETAILED DESCRIPTION

Figure 1:
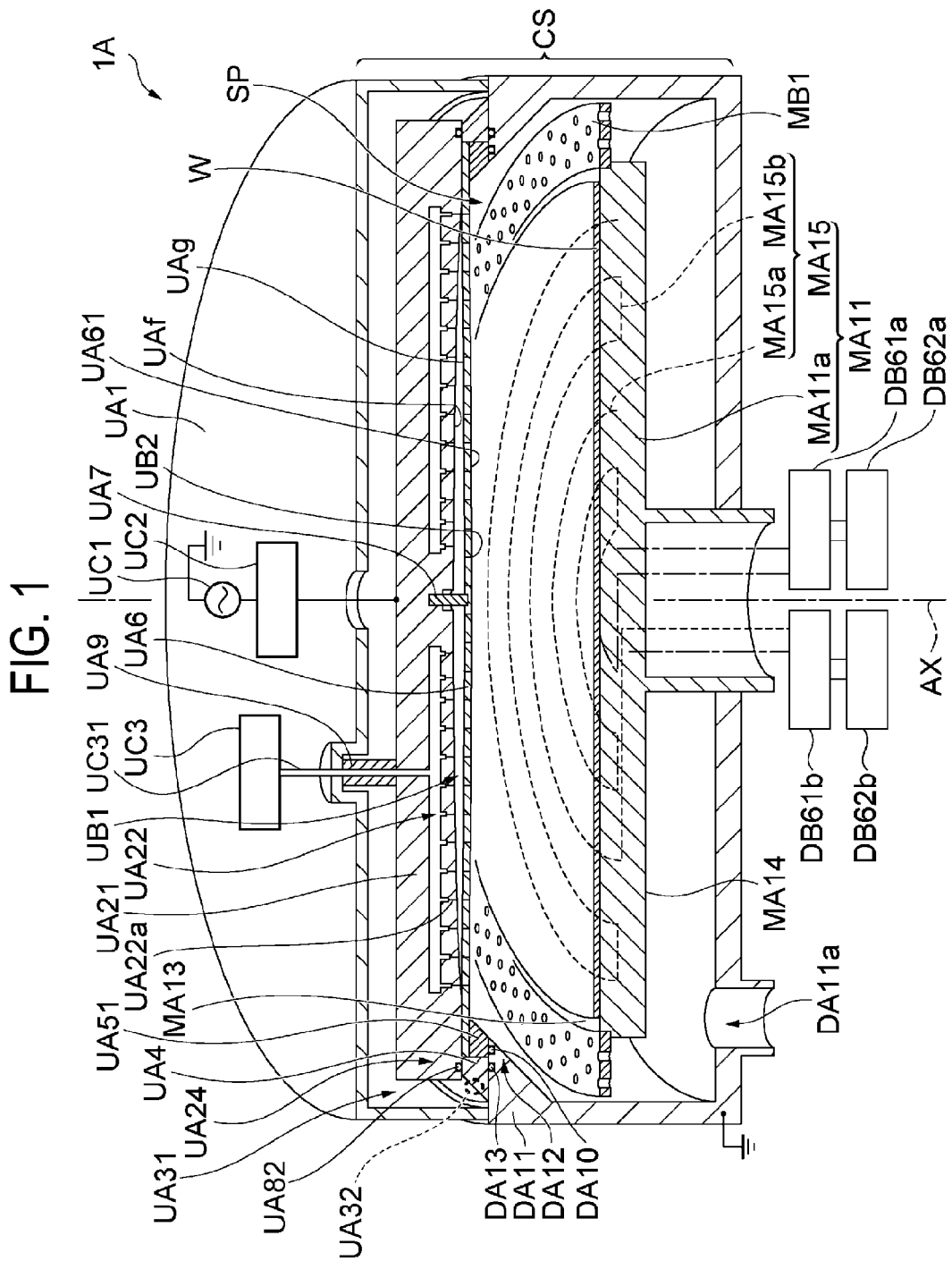
FIG. 1 is a view illustrating the configuration of a plasma processing apparatus according to an exemplary embodiment.

Various exemplary embodiments will now be described.

According to an exemplary embodiment, there is provided a plasma processing apparatus. The plasma processing apparatus includes a process container, a stage, a dielectric plate, an upper electrode, a waveguide, and an end portion of the waveguide. The stage is provided in the process container. The dielectric plate is provided above the upper surface of the stage via a space in the process container. The upper electrode is provided above the dielectric plate. The waveguide guides a high frequency of a VHF band or an UHF band. The end portion of the waveguide is located toward the space and radiates a high frequency into the space. An gap is provided between the upper electrode and the dielectric plate. The width of the gap is non-uniform in a direction in which the dielectric plate extends.

In the case of the high frequency of the VHF band or the UHF band, the uniformity of plasma in a direction in which the lower surface of the dielectric plate extends can be reduced by the generation of a standing wave. However, according to the exemplary embodiment, the generation of the standing wave can be suppressed by the presence of the gap so as to reduce the gradient of an electric field in the vicinity of the upper electrode (more specifically, the dielectric plate) in the space. Therefore, the uniformity of plasma can be improved. Further, according to the exemplary embodiment, the width of the gap is non-uniform in the direction in which the dielectric plate extends (the direction in which the gap extends). That is, the width of the gap can be adjusted so as to suppress the generation of the standing wave. In particular, when the high frequency of the VHF band or the UHF band is radiated into the space, the width of the gap can be adjusted. By this adjustment, the wavelength of a surface wave (electromagnetic wave) propagating between the upper electrode (more specifically, the dielectric plate) and plasma generated in the space at the time of plasma generation can be suitably extended. Therefore, the uniformity of plasma can be further improved.

In the plasma processing apparatus according to an exemplary embodiment, the end portion of the dielectric plate and the end portion of the upper electrode are connected to each other by a press through an elastic member. Therefore, even if each part thermally expands due to heat input from the plasma or the like, problems such as cracking of the dielectric plate can be prevented.

In the plasma processing apparatus according to an exemplary embodiment, the width of the gap increases from the end portion of each of the upper electrode and the dielectric plate toward the center portion thereof. Therefore, the generation of the standing wave due to the surface wave can be prevented.

In the plasma processing apparatus according to an exemplary embodiment, the width of the gap decreases from the end portion of each of the upper electrode and the dielectric plate toward the center portion thereof. Therefore, the attenuation of the surface wave can be suppressed.

In the plasma processing apparatus according to an exemplary embodiment, the lower surface of the upper electrode exposed in the gap has a wavy shape. Therefore, the influence of harmonics caused by the non-linear current-voltage characteristics of plasma sheath can be reduced.

The plasma processing apparatus according to an exemplary embodiment further includes a dielectric rod interposed between the upper electrode and the dielectric plate. The gap is defined by separating the upper electrode and the dielectric plate from each other in a state where the end portion of the upper electrode are in close contact with the end portion of the dielectric plate. Therefore, the gap can be stably provided by the dielectric rod.

The plasma processing apparatus according to an exemplary embodiment further includes a drive mechanism for moving the dielectric rod in a reference direction intersecting the lower surface of the upper electrode exposed in the gap. The dielectric rod is connected to or joined to the dielectric plate, or is integrated with the dielectric plate. As the dielectric rod moves, the dielectric plate moves closer to or farther from the upper electrode. Therefore, by moving the dielectric rod, the width of the gap can be finely adjusted.

In the plasma processing apparatus according to an exemplary embodiment, the drive mechanism drives the dielectric rod in the reference direction to expand/contract the width of the gap.

In the plasma processing apparatus according to an exemplary embodiment, the drive mechanism includes a motor, a first pulley, an insulating shaft, a belt, and a driving part. The motor is provided on the upper electrode. The first pulley, the belt, and the driving part are provided in the upper electrode. The insulating shaft is connected to the motor. The first pulley connects the insulating shaft and the belt. The driving part connects the dielectric rod and the belt and drives the dielectric rod in the reference direction by using the power of the motor transmitted via the insulating shaft and the belt. The driving part includes a second pulley and a shaft. The second pulley connects the belt and the shaft. The shaft is connected to the dielectric rod via a floating joint.

In the plasma processing apparatus according to an exemplary embodiment, the drive mechanism moves the dielectric rod along the reference direction so as to separate the upper electrode and the dielectric plate from each other, so that the width of the gap is widened.

In the plasma processing apparatus according to an exemplary embodiment, the drive mechanism includes a motor, a first pulley, an insulating shaft, a belt, and a driving part. The motor is provided on the upper electrode. The first pulley, the belt, and the driving part are provided in the upper electrode. The insulating shaft is connected to the motor. The first pulley connects the insulating shaft and the belt. The driving part connects the dielectric rod and the belt and drives the dielectric rod in the reference direction by using the power of the motor transmitted via the insulating shaft and the belt. The driving part includes a second pulley and a shaft. The second pulley connects the belt to the shaft. The shaft is connected to the dielectric rod.

In the plasma processing apparatus according to an exemplary embodiment, the dielectric plate is a shower plate. Therefore, since the dielectric plate is a shower plate, a gas can be supplied into the space from the lower surface of the dielectric plate.

In the plasma processing apparatus according to an exemplary embodiment, the upper electrode has a plurality of first gas discharge holes. The dielectric plate has a plurality of second gas discharge holes. The plurality of first gas discharge holes and the plurality of second gas discharge holes communicate with each other through the gap. At least some of the plurality of first gas discharge holes and at least some of the plurality of second gas discharge holes are provided so as to overlap each other. Therefore, since some of the plurality of the first gas discharge holes and some of the plurality of second gas discharge holes are provided to overlap each other, a flow of gas from the upper electrode and the dielectric plate into the space can be good.

In the plasma processing apparatus according to an exemplary embodiment, the gap communicates with a gas pipe connected to an external gas supply part.

In the plasma processing apparatus according to an exemplary embodiment, the stage includes a main body and a conductive layer. The body is formed of an insulator. The conductive layer is provided in the main body. The conductive layer has the shortest distance from the upper surface of the stage, among one or more conductive layers provided in the stage, and is formed in an annular shape. In this way, among the one or more conductive layers provided in the stage, since the conductive layer having the shortest distance from the upper surface of the stage is formed in an annular shape, a high frequency bias applied to a substrate placed on the stage can be suppressed.

In the plasma processing apparatus according to an exemplary embodiment, the conductive layer has an outer diameter smaller than the diameter of the substrate placed on the stage.

In the plasma processing apparatus according to an exemplary embodiment, the conductive layer is any one of an electrode for generating an electrostatic attractive force between the stage and the substrate placed on the stage, an electrode to which a high frequency is supplied, and a grounded electrode.

In the plasma processing apparatus according to an exemplary embodiment, the conductive layer is formed in a mesh shape.

According to an exemplary embodiment, there is provided a plasma processing method. In the plasma processing method, plasma processing is performed on an object to be processed by using a plasma processing apparatus. The plasma processing apparatus includes a process container, an upper electrode, a dielectric plate, a waveguide, and a stage. The stage is provided in the process container. The dielectric plate is provided above the stage via a space of the process container. The upper electrode is provided above the dielectric plate. The waveguide guides a high frequency of a VHF band or an UHF band used for plasma processing. An end portion of the waveguide is located toward the space and radiate a high frequency into the space. In this method, the plasma processing is performed in a state where the width of an gap provided between the upper electrode and the dielectric plate is non-uniform in a direction in which the dielectric plate extends.

In such a plasma processing method, the generation of a standing wave can be suppressed by the presence of the gap so as to reduce the gradient of an electric field in the vicinity of the upper electrode (more specifically, the dielectric plate) in the space. Therefore, the uniformity of plasma can be improved. Further, according to an exemplary embodiment, the width of the gap is non-uniform in the direction in which the dielectric plate extends (the direction in which the gap extends). That is, the width of the gap can be adjusted so as to suppress the generation of the standing wave. In particular, when the high frequency of the VHF band or the UHF band is radiated into the space, the width of the gap can be adjusted. By this adjustment, the wavelength of a surface wave (electromagnetic wave) propagating between the upper electrode (more specifically, the dielectric plate) and plasma generated in the space at the time of plasma generation can be suitably extended. Therefore, the uniformity of plasma can be further improved.

Hereinafter, various exemplary embodiments will be described in detail with reference to the drawings. Throughout the drawings, the same or equivalent parts are denoted by the same reference numerals. In the present disclosure, "contact" refers to a state in which both objects are not fixed, "connection" refers to a state in which both objects may be fixed or not fixed, and "join" refers to a state in which both objects are fixed.

The configuration of a plasma processing apparatus 1A illustrated in FIG. 1 will be described. The plasma processing apparatus 1A includes a process container CS. The plasma processing apparatus 1A includes a space SP, a waveguide wall UA1, an upper electrode UA21, a cavity UA22, and a waveguide UA31. The plasma processing apparatus 1A includes an insulating member UA4, a support ring UA51, a dielectric plate UA6, a dielectric rod UA7, a sealing member UA82, a tube UA9, an gap UB1, and a gas pipe UC31.

The plasma processing apparatus 1A includes a side wall DA11, an exhaust port DA11a, a sealing member DA13, a common mode filter DB61a, a common mode filter DB61b, a heater power supply DB62a, and a heater power supply DB62b.

The plasma processing apparatus 1A includes a stage MA11 and a baffle member MB1.

The process container CS has substantially a cylindrical shape. The process container CS extends along the vertical direction.

A central axial line of the process container CS is an axial line AX extending in the vertical direction. The process container CS includes the waveguide wall UA1, the side wall DA11, and the waveguide UA31.

In the present disclosure, a direction in which the axial line AX extends is referred to as a reference direction. In other words, the reference direction is a direction intersecting the lower surface UAf of the upper electrode UA21 exposed to the gap UB1.

A ceiling portion of the waveguide wall UA1 extends (substantially horizontally) to a plane intersecting the axial line AX. A side portion of the waveguide wall UA1 extends perpendicularly to the ceiling portion of the waveguide wall UA1 along the axial line AX. The waveguide wall UA1 surrounds the upper electrode UA21 of the plasma processing apparatus 1A.

The material of the waveguide wall UA1 can be a conductive material such as aluminum or an aluminum alloy. The waveguide wall UA1 is grounded.

The waveguide UA31 is defined by a space between the waveguide wall UA1 and the upper electrode UA21. The waveguide UA31 guides a high frequency of a VHF band or an UHF band and introduces the high frequency into the space SP. In the present disclosure, the high frequency means a high frequency of a VHF band or an UHF band.

The waveguide UA31 includes an end portion UA32 from which a high frequency is radiated. The end portion UA32 is located toward the space SP.

The end portion UA32 radiates the high frequency into the space SP via the insulating member UA4 and the insulating support ring UA51. The space SP is a space between the dielectric plate UA6 and the stage MA11.

The side wall DA11 extends along the axial line AX below the side portion of the waveguide wall UA1. The side wall DA11 extends along the axial line AX below the waveguide wall UA1.

The material of the side wall DA11 can be a conductive material such as aluminum or an aluminum alloy. The side wall DA11 is grounded.

The side wall DA11 includes a projection DA12. The projection DA12 of the side wall DA11 is provided at an end portion of the side wall DA11 (a portion connected to the side portion of the waveguide wall UA1) and extends toward the axial line AX in a direction intersecting the axial line AX. The projection DA12 is connected to the insulating member UA4 via the sealing member DA13. The sealing member DA13 is a member for vacuum sealing and may be, for example, an O-ring.

The projection DA12 is connected to the support ring UA51 via an elastic member DA10. The support ring UA51 is provided on the projection DA12. The elastic member DA10 is provided for pressing.

The insulating member UA4 is interposed between the end portion UA32, the support ring UA51, and the space SP. The insulating member UA4 and the upper electrode UA21 are connected via the sealing member UA82. The material of the insulating member UA4 may be an insulating material such as aluminum nitride or aluminum oxide. The sealing member UA82 is a member for vacuum sealing and may be, for example, an O-ring.

The upper electrode UA21 is provided above the dielectric plate UA6. The upper electrode UA21 is accommodated in the waveguide wall UA1. The upper electrode UA21 is disposed below the ceiling portion of the waveguide wall UA1 and is surrounded by the side portion of the waveguide wall UA1.

The upper electrode UA21 is provided above the upper surface MA13 of the stage MA11 via the space SP and the dielectric plate UA6 in the process container CS. The upper electrode UA21 is electrically connected to a high frequency power supply UC1 via a matching device UC2.

The material of the upper electrode UA21 can be a conductive material such as aluminum or an aluminum alloy.

A corrosion-resistant film is formed on the surface of the upper electrode UA21. The corrosion-resistant film may be an aluminum oxide film, an yttrium oxide film, or a ceramic film containing aluminum oxide, yttrium oxide, or the like.

The high frequency power supply UC1 is a power supply that generates the above-mentioned high frequency. The matching device UC2 includes a matching circuit that matches the load impedance of the high frequency power supply UC1 with the output impedance of the high frequency power supply UC1.

The upper electrode UA21 includes the cavity UA22. The upper electrode UA21 has a plurality of gas discharge holes UA22a (first gas discharge holes). The cavity UA 22 communicates with a gas supply part UC3 via the gas pipe UC31.

The cavity UA22 communicates with the plurality of gas discharge holes UA22a. The cavity UA 22 communicates with the space SP via the plurality of gas discharge holes UA22a and further the gap UB1 and a plurality of gas discharge holes UB2 of the dielectric plate UA6.

The dielectric plate UA6 is provided directly below the upper electrode UA21. The dielectric plate UA6 is provided above the upper surface MA13 of the stage MA11 via the space SP in the process container CS.

The dielectric plate UA6 has the plurality of gas discharge holes UB2 (second gas discharge holes). In one embodiment, the dielectric plate UA6 is a shower plate.

The plurality of gas discharge holes UA22a and the plurality of gas discharge holes UB2 communicate with each other via the gap UB1. At least some of the plurality of gas discharge holes UA22a and at least some of the plurality of gas discharge holes UB2 are provided so as to overlap each other when viewed from above the upper electrode UA21 (the direction of the axial line AX). For example, it is configured that the gas discharge holes UA22a and the gas discharge holes UB2 arranged in portions where the width of the gap UB1 is smaller more overlap each other.

An end portion of the dielectric plate UA6 is brought into close contact with an end portion of the upper electrode UA21 by the support ring UA51. The dielectric plate UA6 faces the upper surface MA13 of the stage MA11 via the space SP.

A central axial line of the dielectric plate UA6 substantially coincides with the axial line AX. The plurality of gas discharge holes UB2 are arranged on the dielectric plate UA6 so that a gas is evenly supplied to the entire surface of a substrate W (object to be processed) placed on the upper surface MA13 of the stage MA11.

A distance (the width of the space SP) in the vertical direction between the lower surface of the dielectric plate UA6 and the upper surface MA13 of the stage MA11 can be, for example, 5 [cm] or more and 30 [cm] or less.

The dielectric plate UA6 has a flat plate shape and is flexible. The material of the dielectric plate UA6 can be a dielectric such as aluminum nitride or aluminum oxide. The thickness of the dielectric plate UA6 can be substantially uniform. The dielectric plate UA6 has substantially a disc shape. The dielectric plate UA6 is formed of aluminum nitride, aluminum oxide, yttrium oxide, or a dielectric containing aluminum nitride, aluminum oxide, yttrium oxide, or the like. A corrosion-resistant film may be formed on the surface (particularly, the lower surface UA61) of the dielectric plate UA6. The corrosion-resistant film may be an yttrium oxide film, an yttrium oxyfluoride film, an yttrium fluoride film, or a ceramic film containing yttrium oxide, yttrium fluoride, or the like.

The support ring UA51 is a member that closely adheres the dielectric plate UA6 to the upper electrode UA21. The support ring UA51 is connected to the insulating member UA4. The material of the support ring UA51 can be an insulating material such as aluminum nitride or aluminum oxide.

The insulating member UA4 and the support ring UA51 are juxtaposed on the projection DA12 of the side wall DA11. The insulating member UA4 and the support ring UA51 are sandwiched between the projection DA12 and an outer peripheral portion UA24 of the upper electrode UA21.

The dielectric rod UA7 is interposed between the upper electrode UA21 and the dielectric plate UA6. The dielectric rod UA7 can be disposed on the axial line AX. The dielectric rod UA7 extends along the axial line AX.

The dielectric rod UA7 is connected to the upper electrode UA21. The dielectric rod UA7 is in contact with the dielectric plate UA6 or is joined (fixed) to the dielectric plate UA6. The material of the dielectric rod UA7 can be a dielectric such as aluminum nitride or aluminum oxide.

The gap UB1 may be provided between the upper electrode UA21 and the dielectric plate UA6. The gap UB1 can be formed by separating the upper electrode UA21 and the dielectric plate UA6 from each other. The gap UB1 is defined by the lower surface UAf of the upper electrode UA21 and an upper surface UAg of the dielectric plate UA6. The lower surface UAf of the upper electrode UA21 may be an upwardly convex curved surface. The width of the gap UB1 follows a function of the radial position (generally a cosine function or a Gaussian function).

The gap UB1 is defined by separating the upper electrode UA21 and the dielectric plate UA6 from each other in a state where the end portion (the outer peripheral portion UA24) of the upper electrode UA21 and the end portion of the dielectric plate UA6 are in close contact with each other.

The upper electrode UA21 and the dielectric plate UA6 are farthest from each other on the axial line AX on which the dielectric rod UA7 is disposed. The width of the gap UB1 (a distance between the lower surface UAf of the upper electrode UA21 and the upper surface UAg of the dielectric plate UA6) is not uniform (constant), that is, non-uniform, in a direction in which the dielectric plate UA6 (and a dielectric plate UA6a to be described later) extends. When the gap UB1 is provided between the upper electrode UA21 and plasma in this way, a high frequency current flowing from the plasma is reduced, suppressing excitation of the plasma. By optimizing the width of the gap UB1 in the plane of the upper electrode UA21 as in the present embodiment, uniform plasma can be generated on the upper portion of the substrate W.

The stage MA11 includes a main body MA11a and a conductive layer MA15. The stage MA11 is provided in the process container CS. The stage MA11 is configured to substantially horizontally support the substrate W placed on the upper surface MA13 of the stage MA11.

The stage MA11 has substantially a disc shape. The central axial line of the stage MA11 substantially coincides with the axial line AX.

The conductive layer MA15 functions as a heater (resistive heating element) that heats the substrate W placed on the upper surface MA13 through the upper surface MA13 of the stage MA11. The conductive layer MA15 includes a heater member MA15a and a heater member MA15b. The material of the conductive layer MA15 can be metal such as tungsten or molybdenum.

The heater member MA15a and the heater member MA15b are buried inside the main body MA11a. The heater member MA15a and the heater member MA15b are not in contact with each other. The material of the main body MA11a is an insulator such as aluminum nitride or aluminum oxide.

A heating region of the stage MA11 is divided into two zones in the radial direction. Each of the zones is heated by the conductive layer MA15.

The heater member MA15a heats a zone in the center portion of the main body MA11a. The heater member MA15b heats a zone in the outer peripheral portion of the main body MA11a.

The common mode filter DB61a is electrically connected to the heater member MA15a. The heater power supply DB62b is electrically connected to the common mode filter DB61a.

The common mode filter DB61b is electrically connected to the heater member MA15b. The heater power supply DB62b is electrically connected to the common mode filter DB61b. The common mode filter DB61a is provided between the heater member MA15a and the heater power supply DB62a, and the common mode filter DB61b is provided between the heater member MA15b and the heater power supply DB62b.

The common mode filter DB61a and the common mode filter DB61b each has a relatively high common mode impedance at a plasma excitation frequency. Therefore, the electrical coupling between the heater member MA15a and the heater member MA15b can be weakened. As a result, at the outer peripheral portion and the center portion of the main body MA11a of the stage MA11, the electrical coupling between plasma, the heater member MA15a, and the heater member MA15b is suppressed, so that a high frequency electric field applied between the center portion and the end portion of the substrate W can be suppressed.

The baffle member MB1 extends between the stage MA11 and the side wall DA11. The baffle member MB1 is substantially an annular plate material. The material of the baffle member 13 can be, for example, an insulator such as aluminum nitride or aluminum oxide.

A plurality of through-holes are formed in the baffle member MB1. The plurality of through-holes penetrate the baffle member MB1 in its thickness direction of the plate.

A region under the back surface MA14 of the stage MA11 communicates with the exhaust port DA11a. The exhaust port DA11a is connected to an external exhaust device. The exhaust device may include a pressure control valve and a vacuum pump such as a turbo molecular pump and/or a dry pump.

The gas supply part UC3 is connected to the plasma processing apparatus 1A. The gas supply part UC3 is protected from a high frequency by the insulating tube UA9 and is connected to the gas pipe UC31 communicating with the cavity UA22 in the upper electrode UA21.

A gas from the gas supply part UC3 is supplied into space SP via the gas pipe UC31, the cavity UA22, the plurality of gas discharge holes UA22a, the gap UB1, and the plurality of gas discharge holes UB2 sequentially. The gas supply part UC3 includes one or more gas sources used for processing the substrate W. The gas supply part UC3 includes one or more flow rate controllers for controlling the flow rate of gases from the one or more gas sources.

The gas pipe UC31 that communicates the gas supply part UC3 and the cavity UA22 with each other is covered with the insulating tube UA9 in the waveguide UA31 and is protected from a high frequency in the waveguide UA31 by the tube UA9. The material of the tube UA9 can be an insulating material such as aluminum nitride or aluminum oxide.

In the plasma processing apparatus 1A, the area of the inner wall surface (more specifically, the side wall DA11) of the process container CS extending from the upper side of the baffle member MB1 is approximately equal to the surface area of the dielectric plate UA6 (the area of the lower surface UA61) on the space SP side. That is, the area of a plane set to the ground potential (ground plane) among planes defining the space SP is approximately equal to the area of a plane provided by the dielectric plate UA6 among the planes defining the space SP. With this configuration, plasma is generated at a uniform density in a region directly below the dielectric plate UA6 and a region around the ground plane. This results in improvement of the in-plane uniformity of the plasma processing of the substrate W.

In the plasma processing apparatus 1A, a high frequency is introduced from the end portion UA32 of the waveguide UA31 into the space SP toward the axial line AX. When the high frequency is introduced into the space SP, a gas is excited in the space SP and plasma is generated from the gas. The plasma is generated in the space SP with a uniform density distribution in the circumferential direction. The substrate W on the stage MA11 is processed with chemical species from the plasma.

Hereinafter, a plasma processing apparatus 1B according to another exemplary embodiment will be described with reference to FIG. 2. A distance (the width of a space SP) in the vertical direction between the lower surface UA61 of a dielectric plate UA6 and the upper surface MA13 of a stage MA11 in the plasma processing apparatus 1B can be shorter than that in the case of the plasma processing apparatus 1A. This distance may be, for example, 5 [mm] or more and 15 [mm] or less. The configuration of the plasma processing apparatus 1B is different from the configuration of the plasma processing apparatus 1A depending on the difference in the width of the space SP.

The plasma processing apparatus 1B includes a process container CS. The plasma processing apparatus 1B includes a space SP, a waveguide wall UA1, an upper electrode UA21, a cavity UA22, a waveguide UA31, an insulating member UA4, a support ring UA51, a cover ring UA52, a dielectric plate UA6, an elastic member UA81, a sealing member UA82, and a tube UA9. The plasma processing apparatus 1B includes an gap UB1, a gas pipe UC31, and a drive mechanism UD10.

The plasma processing apparatus 1B includes a stage MA11, a conductive part MA21, a conductive plate MA22, a conductive elastic member MA23, an exhaust chamber MA31, a wall part MA32, and a vent hole MA33.

The plasma processing apparatus 1B includes a sealing member DA13, an inlet/outlet DA2, a support part DB11, an exhaust pipe DB12, a bellows DB21, a bellows DB22, a spring DB3, and a water cooling plate DB4.

The process container CS includes the waveguide wall UA1, a side wall DA11, and the waveguide UA31.

Hereinafter, the description of the plasma processing apparatus 1B will be given mainly to only a configuration different from that of the plasma processing apparatus 1A.

A projection DA12 of the side wall DA11 is provided at an end portion of the side wall DA11 (a portion connected to a side portion of the waveguide wall UA1) and extends in a direction intersecting an axial line AX toward the axial line AX.

The projection DA12 is connected to the wall part MA32 of the exhaust chamber MA31 via the conductive elastic member MA23. The conductive elastic member MA23 is an elastic body and may be, for example, a spiral ring. The material of the conductive elastic member MA23 is, for example, metal such as stainless steel, Inconel, nickel, tungsten, tantalum, a copper alloy, or molybdenum. The conductive elastic member MA23 may be coated with a protective film such as nickel, aluminum, stainless steel or gold.

The insulating member UA4 is interposed between the end portion UA32 of the waveguide UA31 and the space SP.

The support ring UA51 is connected to the insulating member UA4 via the elastic member UA81. The elastic member UA81 can be, for example, a stainless steel spring.

The end portion of the dielectric plate UA6 and the end portion (the outer peripheral portion UA24) of the upper electrode UA21 are connected to each other by pressing via the elastic member UA81 or the like.

The cover ring UA52 is a member that prevents plasma from being generated in the vicinity of the side surface of the stage MA11. The material of the cover ring UA52 can be an insulating material such as aluminum nitride or aluminum oxide.

The plasma processing apparatus 1B further includes the drive mechanism UD10. The drive mechanism UD10 includes a motor UD11, an insulating shaft UD12, a pulley UD13 (first pulley), a belt UD14, and a driving part UD15a.

The motor UD11 is provided on the waveguide wall UA1. The pulley UD13, the belt UD14, and the driving part UD15a (further, a driving part UD15b illustrated in FIG. 5 to be described later) are provided in the upper electrode UA21.

The insulating shaft UD12 is connected to the motor UD11. The pulley UD13 connects the insulating shaft UD12 and the belt UD14.

The insulating shaft UD12 rotates by the rotational drive of the motor UD11. The pulley UD13 changes the rotational movement of the insulating shaft UD12 into the linear movement of the belt UD14.

The linear movement of the belt UD14 is transmitted to the driving part UD15a, so that the movement of a dielectric rod UD15a9 (which will be described later with reference to FIGS. 3 and 4) of the driving part UD15a (the movement in the reference direction intersecting the lower surface UAf of the upper electrode UA21) can be performed. The configuration of the driving part UD15a will be described in detail later.

The gap UB1 is formed by separating the upper electrode UA21 and the dielectric plate UA6 from each other. The width of the gap UB1 (a distance between the upper electrode UA21 and the dielectric plate UA6) can be adjusted by the drive mechanism UD10. The upper electrode UA21 and the dielectric plate UA6 can be farthest from each other on the axial line AX on which the driving part UD15a having the dielectric rod UD15a9 is disposed.

The material of the stage MA11 of the plasma processing apparatus 1B can be a conductive material such as aluminum or an aluminum alloy. A protective film made of yttrium oxide, yttrium oxyfluoride, or aluminum oxide may be provided on the surface of the stage MA11.

The exhaust chamber MA31 includes the conductive wall part MA32. The exhaust chamber MA31 extends from around the outer peripheral portion MA12 toward the side wall DA11.

The wall part MA32 includes the vent hole MA33. The exhaust chamber MA31 communicates with the space SP. The space SP communicates with the exhaust chamber MA31 via the vent hole MA33. The exhaust chamber MA31 communicates with the exhaust pipe DB12.

The material of the wall part MA32 can be a conductive material such as aluminum or an aluminum alloy.

The exhaust pipe DB12 is connected to an external exhaust device. The exhaust device system may include a pressure control valve and a vacuum pump such as a turbo molecular pump and/or a dry pump.

A gas in the space SP can move to the exhaust chamber MA31 through the vent hole MA33 and can be exhausted to the outside through the exhaust pipe DB12.

The conductive part MA21 extends between the outer peripheral portion MA12 of the stage MA11 and the side wall DA11 of the process container CS. The conductive part MA21 is electrically connected to a conductive layer of the stage MA11 and the side wall DA11 of the process container CS.

The conductive part MA21 extends from the outer peripheral portion MA12 toward the side wall DA11 so that a high frequency radiated from the end portion UA32 of the waveguide UA31 is introduced into the space SP. The conductive part MA21 includes the conductive plate MA22. The conductive part MA21 includes a portion of the wall part MA32.

The conductive plate MA22 is in electrical contact with the back surface MA14 of the stage MA11 at the outer peripheral portion MA12. The conductive plate MA22 is joined (fixed) to the back surface of the outer peripheral portion MA12 and the upper surface of the wall part MA32 by screws (not shown).

The conductive plate MA22 is a flexible thin plate. The material of the conductive plate MA22 is, for example, a conductive material such as aluminum, an aluminum alloy, stainless steel, Inconel, nickel, tungsten, tantalum, a copper alloy, or molybdenum. The conductive plate MA22 may be coated with a protective film such as aluminum oxide, yttrium oxide, yttrium oxyfluoride, yttrium fluoride, nickel, aluminum, stainless steel, or gold.

The side wall DA11 includes the inlet/outlet DA2. A substrate W is loaded into and unloaded from the process container CS via the inlet/outlet DA2.

The support part DB11 is connected to the stage MA11. The stage MA11 is provided on the support part DB11. The stage MA11 moves up and down by moving the support part DB11 up and down (by approaching the upper electrode UA21 or moving away from the upper electrode UA21, the same applies hereinafter).

A water-cooled plate DB4 is disposed below the support part DB11. The support part DB11 is in contact with the water-cooled plate DB4. The heat of the stage MA11 can be discharged to the outside through the support part DB11 and the water-cooled plate DB4.

The exhaust pipe DB12 is connected to the wall part MA32 and communicates with the exhaust chamber MA31. The wall part MA32 is provided on the exhaust pipe DB12. A gas in the exhaust chamber MA31 can be discharged to the outside through the exhaust pipe DB12.

The exhaust chamber MA31 and the wall part MA32 move up and down by moving the exhaust pipe DB12 up and down through the spring DB3.

The material of the bellows DB22 can be a conductive material such as stainless steel. The material of the spring DB3 can be a conductive material such as stainless steel.

The wall part MA32 can be stably disposed on the side (upper side) of the upper electrode UA21 due to the elasticity of the spring DB3. As a result, the outer peripheral portion of the wall part MA32 comes into close contact with the back surface of the projection DA12. Further, the outer peripheral portion of the wall part MA32 can come in stable and electrical contact with the projection DA12 due to the elasticity of the conductive elastic member MA23.

In the plasma processing apparatus 1B, a high frequency is introduced into the space SP from the end portion UA32 of the waveguide UA31 via the insulating member UA4 toward the axial line AX. When the high frequency is introduced into the space SP, a gas is excited in the space SP and plasma is generated from the gas. The plasma is generated in the space SP with a uniform density distribution in the circumferential direction. The substrate W on stage MA11 is processed with chemical species from the plasma. Further, discharge to the peripheral portion of the space SP can be suppressed by the insulating member UA4.

Figure 3:
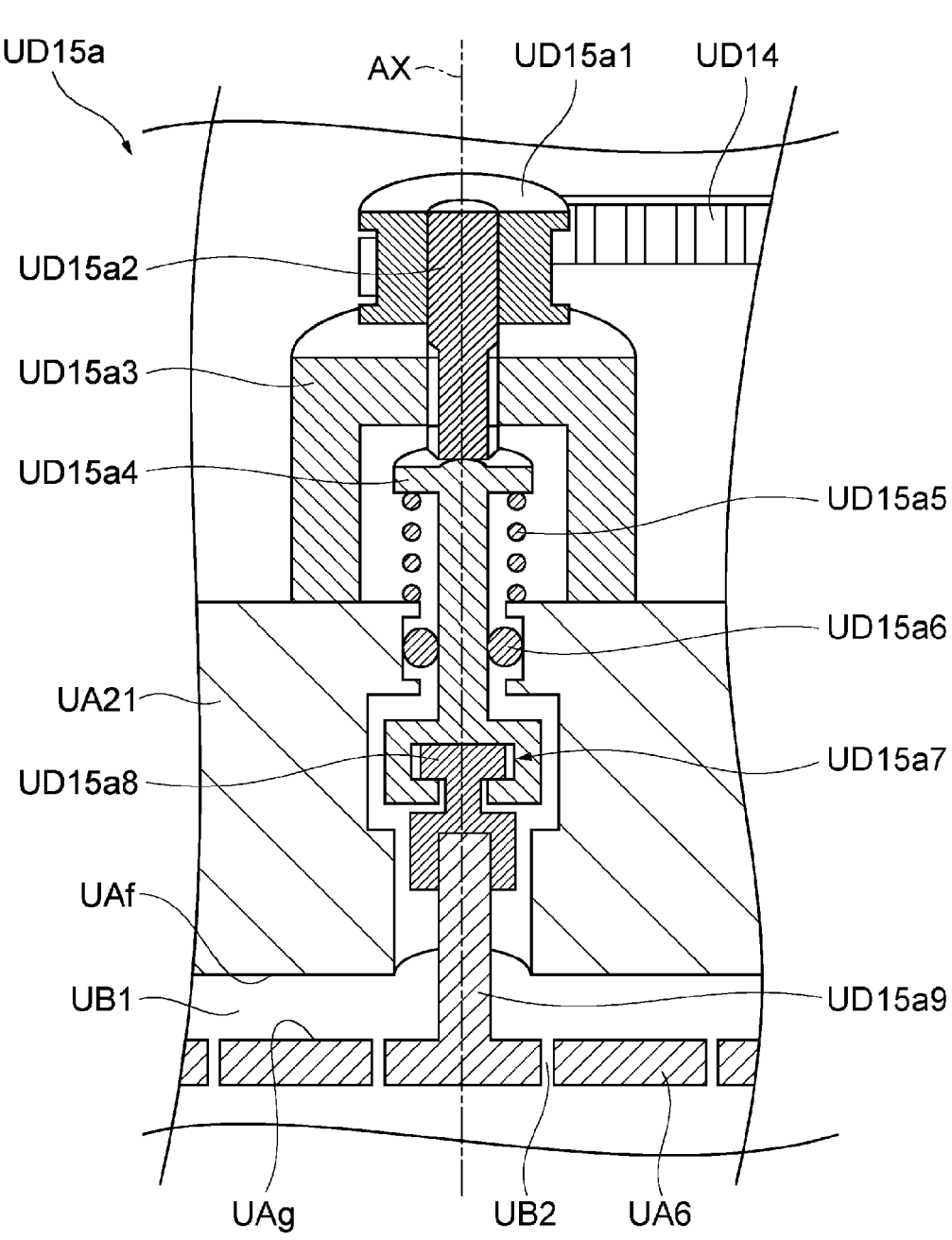
FIG. 3 is a view illustrating in detail a portion of the configuration illustrated in FIG. 2.
Figure 4:
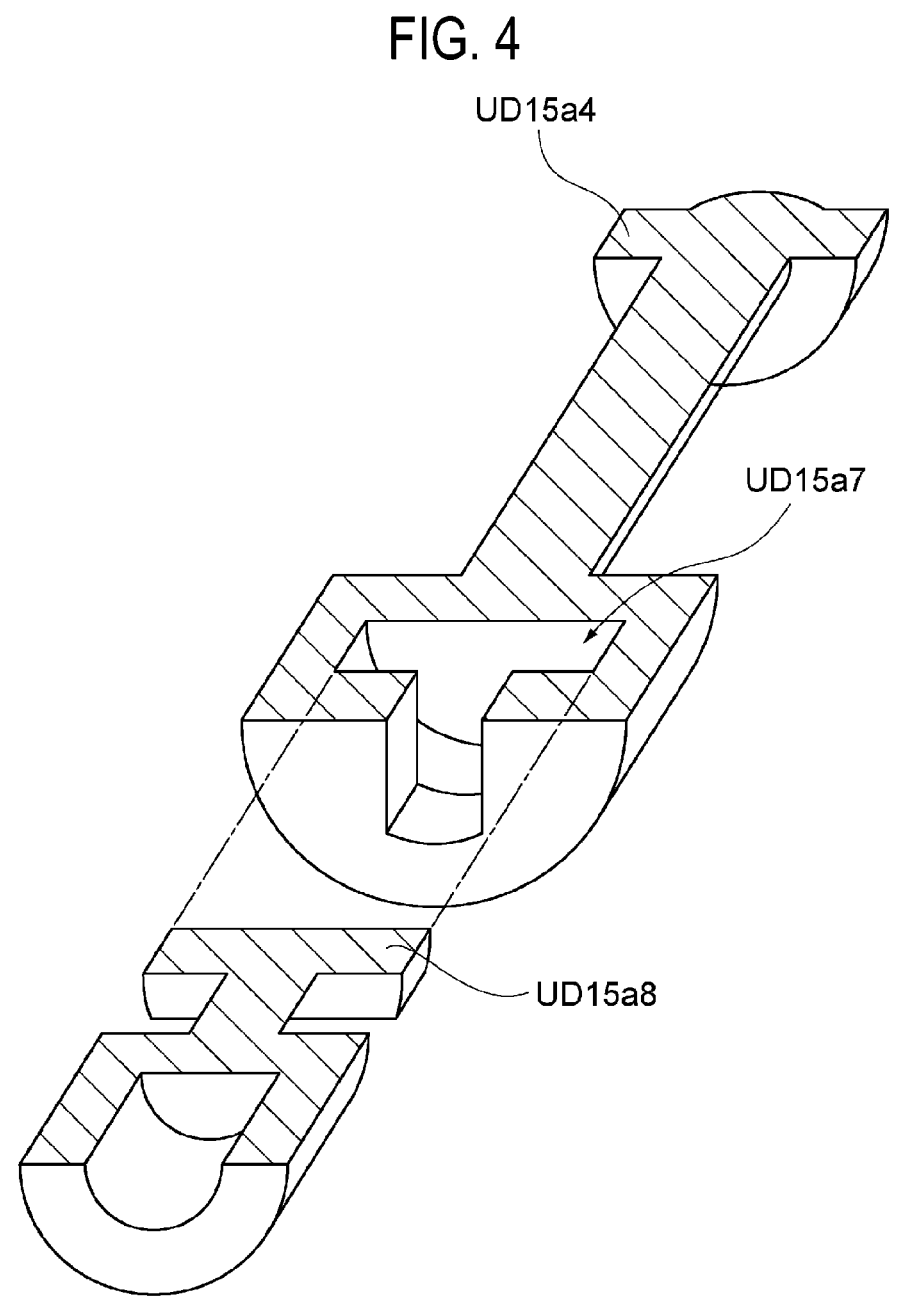

Hereinafter, the configuration of the driving part UD15a will be described with reference to FIGS. 3 and 4. The driving part UD15a includes a pulley UD15a1 (second pulley), an adjusting screw UD15a2, a container UD15a3, a shaft UD15a4, and a spring UD15a5. The material of the spring UD15a5 can be, for example, stainless steel.

The driving part UD15a further includes an O-ring UD15a6, a male portion UD15a8 of a floating joint, and a dielectric rod UD15a9. The material of the dielectric rod UD15a9 can be a dielectric such as aluminum nitride or aluminum oxide.

The dielectric rod UD15a9 is interposed between the upper electrode UA21 and the dielectric plate UA6. The dielectric rod UD15a9 can be disposed on the axial line AX.

The dielectric rod UD15a9 is integrated with the dielectric plate UA6 or is connected or joined (fixed) to the dielectric plate UA6.

In a state where the end portion of the dielectric plate UA6 is brought into close contact with the end portion (the outer peripheral portion UA24) of the upper electrode UA21 by the support ring UA51, the dielectric rod UD15a9 can increase or decrease a distance (the width of the gap UB1) between the upper electrode UA21 and the dielectric plate UA6.

The drive mechanism UD10 including the driving part UD15a drives the dielectric rod UD15a9 in the reference direction to increase or decrease the width of the gap UB1. The driving part UD15a connects the dielectric rod UD15a9 and the belt UD14 and drives the dielectric rod UD15a9 in the reference direction by using the power of the motor UD11 transmitted via the insulating shaft UD12 and the belt UD14.

The pulley UD15a1 includes the adjusting screw UD15a2. The pulley UD15a1 connects the belt UD14 and the shaft UD15a4. The shaft UD15a4 includes a female portion UD15a7 of the floating joint.

The central axes of the adjusting screw UD15a2 and the shaft UD15a4 substantially coincide with the axial line AX. Each of the adjusting screw UD15a2 and the shaft UD15a4 can move linearly along the axial line AX.

The shaft UD15a4 is connected to the dielectric rod UD15a9 via the floating joint (the female portion UD15a7 of the floating joint and the male portion UD15a8 of the floating joint).

The central axes of the female portion UD15a7 of the floating joint, the male portion UD15a8 of the floating joint, and the dielectric rod UD15a9 substantially coincide with the axial line AX. Each of the female portion UD15a7 of the floating joint, the male portion UD15a8 of the floating joint, and the dielectric rod UD15a9 can move linearly along the axial line AX.

The pulley UD15a1 is connected to the belt UD14. The pulley UD15a1 changes the linear movement of the belt UD14 into the rotational movement of the adjusting screw UD15a2 around the axial line AX and the linear movement of the adjusting screw UD15a2 along the axial line AX.

The adjusting screw UD15a2 is held in the container UD15a3. The container UD15a3 is joined (fixed) in the upper electrode UA21. The upper end of the shaft UD15a4 and the spring UD15a5 are accommodated in the container UD15a3.

The lower end of the adjusting screw UD15a2 contacts the upper end of the shaft UD15a4. The lower end of the adjusting screw UD15a2 is brought into close contact with the upper end of the shaft UD15a4 by the elastic force of the spring UD15a5. The shaft UD15a4 moves linearly along the axial line AX in accordance with the linear movement of the adjusting screw UD15a2 along the axial line AX.

The O-ring UD15a6 can stabilize the disposition of the shaft UD15a4 in the upper electrode UA21 and seal the gap UB1.

The lower end of the shaft UD15a4 has the female portion UD15a7 of the floating joint. The male portion UD15a8 of the floating joint is fitted into the female portion UD15a7 of the floating joint. The male portion UD15a8 of the floating joint moves linearly along the axial line AX in accordance with the linear movement of the shaft UD15a4 along the axial line AX.

The lower end of the male portion UD15a8 of the floating joint is connected to the dielectric rod UD15a9. The dielectric rod UD15a9 moves linearly along the axial line AX in accordance with the linear movement of the male portion UD15a8 of the floating joint along the axial line AX.

That is, the dielectric rod UD15a9 can move linearly along the axial line AX due to the rotational movement of the insulating shaft UD12 by the motor UD11. More specifically, the dielectric rod UD15a9 can receive power from the motor UD11 via the floating joint. Therefore, even if the axes of the shaft UD15a4 and the dielectric rod UD15a9 are slightly deviated from each other, the dielectric plate UA6 and the upper electrode UA21 can be separated from and brought close to each other by driving the dielectric rod UD15a9.

Further, since the rotational movement of the insulating shaft UD12 by the motor UD11 can be transmitted to the adjusting screw UD15a2 by the belt UD14, the motor UD11 can be provided at a position away from the axial line AX on the ceiling portion of the waveguide wall UA1. Therefore, the disposition position of the motor UD11 can be selected relatively flexibly on the waveguide wall UA1.

Figure 5:
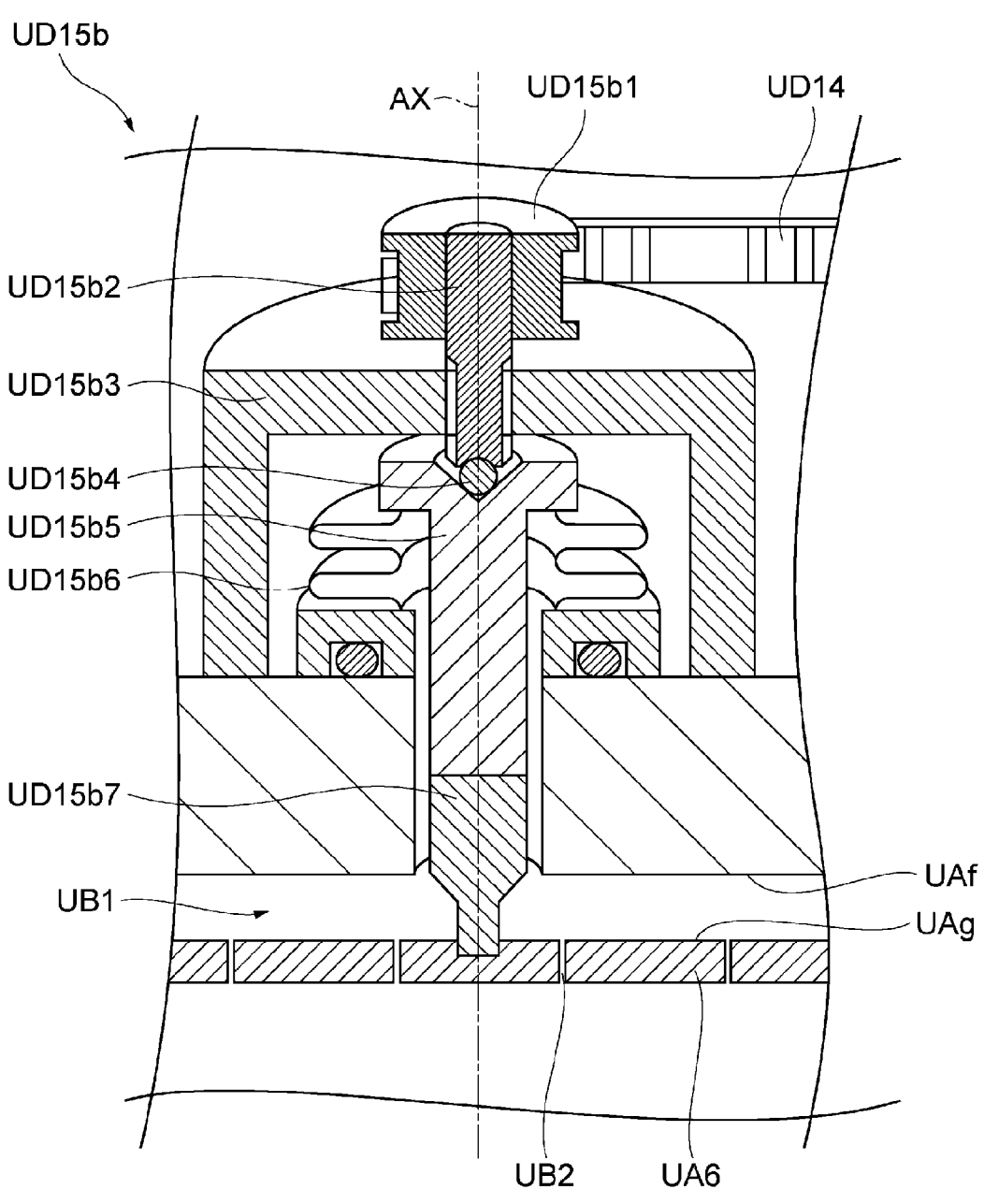
FIG. 5 is a view illustrating in more detail another configuration that can be used in place of the configuration illustrated in FIG. 3.

The drive mechanism UD10 can include the driving part UD15b illustrated in FIG. 5 in place of the above-described driving part UD15a. The driving part UD15b is disposed in the upper electrode UA21 in the same manner as the driving part UD15a.

The driving part UD15b includes a pulley UD15b1 (second pulley), an adjusting screw UD15b2, a container UD15b3, a ball UD15b4, a shaft UD15b5, a bellows UD15b6, and a dielectric rod UD15b7.

The dielectric rod UD15b7 is interposed between the upper electrode UA21 and the dielectric plate UA6. The dielectric rod UD15b7 can be disposed on the axial line AX.

The lower portion of the dielectric rod UD15b7 is fitted into a hole provided in the upper surface UAg of the dielectric plate UA6. The material of the dielectric rod UD15b7 can be a dielectric such as aluminum nitride or aluminum oxide.

The drive mechanism UD10 including the driving part UD15b can linearly move the dielectric rod UD15b7 along the reference direction so as to separate the upper electrode UA21 from the dielectric plate UA6, so that the width of the gap UB1 can be increased.

The driving part UD15b connects the dielectric rod UD15b7 and the belt UD14 and drives the dielectric rod UD15b7 in the reference direction by using the power of the motor UD11 transmitted via the insulating shaft UD12 and the belt UD14.

The pulley UD15b1 includes the adjusting screw UD15b2. The pulley UD15b1 connects the belt UD14 to the shaft UD15b5. The shaft UD15b5 is connected to the dielectric rod UD15b7.

The central axes of the adjusting screw UD15b2, the shaft UD15b5, and the dielectric rod UD15b7 substantially coincide with the axial line AX. Each of the adjusting screw UD15b2, the shaft UD15b5, and the dielectric rod UD15b7 can move linearly along the axial line AX.

The pulley UD15b1 is connected to the belt UD14. The pulley UD changes the linear movement of the belt UD14 into the rotational movement of the adjusting screw UD15b2 around the axial line AX and the linear movement of the adjusting screw UD15b2 along the axial line AX.

The adjusting screw UD15b2 is held in the container UD15b3. The container UD15b3 is connected to the upper electrode UA21. The ball UD15b4, the upper end of the shaft UD15b5, and the bellows UD15b6 are accommodated in the container UD15a3.

The lower end of the adjusting screw UD15b2 is connected to the upper end of the shaft UD15b5 via the ball UD15b4. The upper end of the shaft UD15b5 is brought into close contact with the lower end of the adjusting screw UD15b2 via the ball UD15b4 by the elastic force of the bellows UD15b6. The lower end of the adjusting screw UD15b2 is brought into close contact with the ball UD15b4 in a state where the ball UD15b4 is pressed by the adjusting screw UD15b2. The shaft UD15b5 moves linearly along the axial line AX in accordance with the linear movement of the adjusting screw UD15b2 along the axial line AX.

In this way, since the adjusting screw UD15b2 and the shaft UD15b5 are not joined (fixed) (connected via the ball UD15b4), they can be separated from each other.

The bellows UD15b6 can seal the gap UB1. The material of the bellows UD15b6 can be stainless steel, an aluminum alloy, or the like.

The lower end of the shaft UD15b5 is connected to the upper end of the dielectric rod UD15b7. The lower end of the dielectric rod UD15b7 is connected to the dielectric plate UA6. The dielectric rod UD15b7 moves linearly along the axial line AX in accordance with the linear movement of the shaft UD15b5 along the axial line AX.

That is, the dielectric rod UD15b7 can move linearly along the axial line AX due to the rotational movement of the insulating shaft UD12 by the motor UD11. More specifically, the dielectric rod UD15b7 can be driven to separate the dielectric plate UA6 from the upper electrode UA21.

Further, since the rotational movement of the insulating shaft UD12 by the motor UD11 can be transmitted to the adjusting screw UD15b2 by the belt UD14, the motor UD11 can be provided at a position away from the axial line AX on the ceiling portion of the waveguide wall UA1. Therefore, the disposition position of the motor UD11 can be selected relatively flexibly on the waveguide wall UA1.

Hereinafter, a plasma processing apparatus 1C according to another exemplary embodiment will be described with reference to FIG. 6. The plasma processing apparatus 1C includes a process container CS. The plasma processing apparatus 1C includes a space SP, a waveguide wall UA1, an upper electrode UA21a, a waveguide UA31, an insulating member UA4, a dielectric plate UA6a, a sealing member UA82, a sealing member UA83, a tube UA9, an gap UB1, and a gas pipe UC31.

The plasma processing apparatus 1C includes a side wall DA11, an exhaust port DA11a, a sealing member DA13, and an elastic member DA14.

The plasma processing apparatus 1C includes a stage MA11 and a plasma shielding plate MB2.

The process container CS includes the waveguide wall UA1, the side wall DA11, and the waveguide UA31.

Hereinafter, the description of the plasma processing apparatus 1C will be given mainly to only a configuration different from those of the plasma processing apparatus 1A and the plasma processing apparatus 1B.

The side wall DA11 includes a gas chamber MA41, a wall part MA42, and a plurality of gas discharge grooves MA43.

The gas chamber MA41, the wall part MA42, and the gas discharge grooves MA43 are provided at the end portion of the side wall DA11 (a portion connected to the side portion of the waveguide wall UA1) and extend to a direction intersecting the axis line AX toward the axis line AX. The wall part MA42 is connected to the insulating member UA4 via the sealing member DA13.

A gas supplier UD2 is connected to the gas chamber MA41, and a gas supplied from the gas supplier UD2 can be stored in the gas chamber MA41. The gas discharge grooves MA43 are connected to the gas chamber MA41, and the gas stored in the gas chamber MA41 is supplied to the upper side of the space SP (directly below the lower surface UA61 of the dielectric plate UA6a) via the gas discharge grooves MA43.

The upper electrode UA21a is provided above the dielectric plate UA6a. The upper electrode UA21a is accommodated in the waveguide wall UA1. The upper electrode UA21a is disposed below the ceiling portion of the waveguide wall UA1 and is surrounded by the side portion of the waveguide wall UA1.

The upper electrode UA21a is provided above the upper surface MA13 of the stage MA11 via the space SP and the dielectric plate UA6a in the process container CS. The upper electrode UA21a is electrically connected to a high frequency power supply UC1 via a matching device UC2.

The material of the upper electrode UA21a can be a conductive material such as aluminum or an aluminum alloy. A corrosion-resistant film is formed on the surface of the upper electrode UA21a. The corrosion-resistant film can be an aluminum oxide film, an yttrium oxide film, or a ceramic film containing aluminum oxide, yttrium oxide, or the like.

The dielectric plate UA6a is a dielectric cover and is provided directly below the upper electrode UA21a in the space SP. The dielectric plate UA6a is provided above the upper surface MA13 of the stage MA11 via the space SP in the process container CS.

The end portion of the dielectric plate UA6a is brought into close contact with the end portion (the outer peripheral portion UA24) of the upper electrode UA21a by the insulating member UA4. The end of the dielectric plate UA6a is connected to the upper electrode UA21a via the elastic member DA14 and to the insulating member UA4 via the sealing member UA83. The sealing member UA83 is a member for vacuum sealing and can be, for example, an O-ring. The sealing member UA83 can prevent a gas above the dielectric plate UA6a from leaking into the space SP.

The elastic member DA14 can be an O-ring or the like. The dielectric plate UA6a faces the upper surface MA13 of the stage MA11 via the space SP. The central axial line of the dielectric plate UA6a substantially coincides with the axial line AX.

The dielectric plate UA6a has flexibility. The dielectric plate UA6a is formed of aluminum nitride, aluminum oxide, yttrium oxide, or a dielectric containing aluminum nitride, aluminum oxide, yttrium oxide, or the like. A corrosion-resistant film may be formed on the surface (particularly, the lower surface UA61) of the dielectric plate UA6a. The corrosion-resistant film can be an yttrium oxide film, an yttrium oxyfluoride film, an yttrium fluoride film, or a ceramic film containing yttrium oxide, yttrium fluoride, or the like. The thickness of the dielectric plate UA6a can be substantially uniform.

The dielectric plate UA6a has substantially a disc shape. A distance (the width of the space SP) in the vertical direction between the lower surface of the dielectric plate UA6a and the upper surface MA13 of the stage MA11 can be, for example, 5 [cm] or more and 10 [cm] or less. The insulating member UA4 brings the dielectric plate UA6a into close contact with the upper electrode UA21a.

The gap UB1 is formed by separating the upper electrode UA21a and the dielectric plate UA6a from each other. More specifically, the gap UB1 is a space between the lower surface UAf of the upper electrode UA21a and the upper surface UAg of the dielectric plate UA6a and is defined by the lower surface UAf and the upper surface UAg. The upper electrode UA21a and the dielectric plate UA6a can be farthest from each other on the axial line AX in a state where the end portion of the dielectric plate UA6a is brought into close contact with the end portion (the outer peripheral portion UA24) of the upper electrode UA21a by the insulating member UA4.

The gas pipe UC31 connected to an external gas supply part UC3 is connected to the gap UB1, so that the gap UB1 communicates with the gas pipe UC31. A gas supplied from the gas supply part UC3 flows into the gap UB1 via the gas pipe UC31. By adjusting the pressure in the gap UB1 by the inflow of the gas, the width of the gap UB1 (the length between the lower surface UAf of the upper electrode UA21a and the upper surface UAg of the dielectric plate UA6) can be adjusted.

The stage MA11 of the plasma processing apparatus 1C has the same configuration as the stage MA11 of the plasma processing apparatus 1B.

In one embodiment, the plasma processing apparatus 1C may further include the plasma shielding plate MB2. The plasma shielding plate MB2 extends between the stage MA11 and the side wall DA11. The plasma shielding plate MB2 is substantially an annular plate member. The material of the plasma shielding plate MB2 can be, for example, aluminum oxide, quartz, or the like.

One peripheral edge (outer diameter) of the plasma shielding plate MB2 is connected to the side wall DA11. A gap is provided between the other peripheral edge (inner diameter) of the plasma shielding plate MB2 and the stage MA11 (further a substrate W placed on the upper surface MA13 of the stage MA11). A gas in the space SP can flow from this gap through a space under the stage MA11 and can be further discharged to the outside through the exhaust port DA11a.

In the plasma processing apparatus 1C, the area of the inner wall surface of the process container CS (for example, the inner wall surface of the side wall DA11) extending above the plasma shielding plate MB2 is approximately equal to the surface area of the dielectric plate UA6 on the space SP side. That is, the area of a plane set to the ground potential (ground plane) among planes defining the space SP is approximately equal to the area of a plane provided by the dielectric plate UA6a among the planes defining the space SP. With this configuration, plasma is generated at a uniform density in a region directly below the dielectric plate UA6a and a region around the ground plane. This results in improvement of the in-plane uniformity of the plasma processing of the substrate W.

In the plasma processing apparatus 1C, a high frequency is introduced from the end portion UA32 of the waveguide UA31 into the space SP toward the axial line AX. When the high frequency is introduced into the space SP, a gas is excited in the space SP and plasma is generated from the gas. The plasma is generated in the space SP with a uniform density distribution in the circumferential direction. The substrate W on the stage MA11 is processed with chemical species from the plasma.

Next, a specific example of the shape of the gap UB1 will be described. The shape of the gap UB1 is defined by the lower surface UAf and the upper surface UAg as described above. As illustrated in FIGS. 1, 2, and 6, the shape of the lower surface UAf can be a relatively smooth and convex curved surface as an example.

Figure 2:
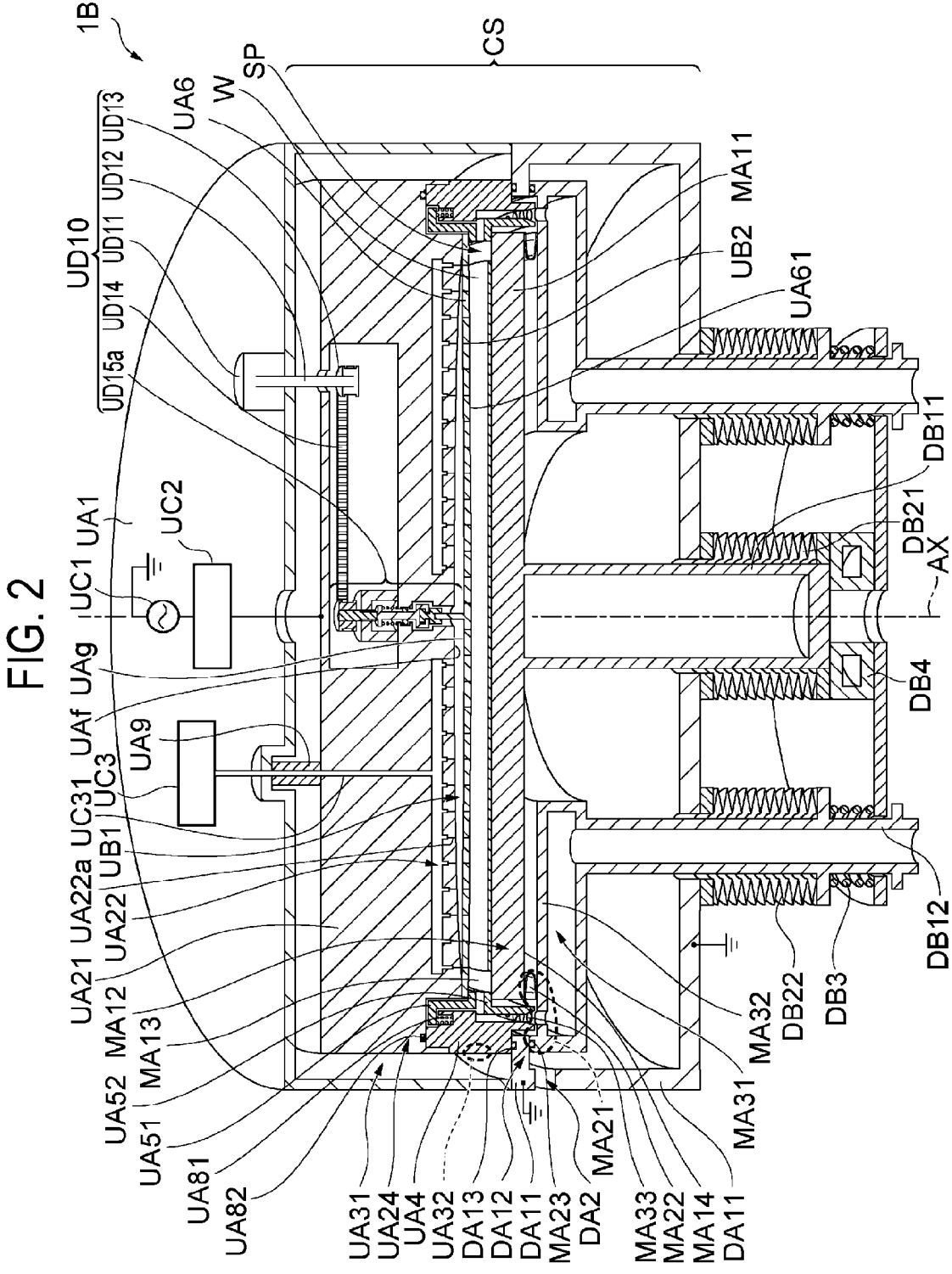
FIG. 2 is a view illustrating the configuration of a plasma processing apparatus according to another exemplary embodiment.
Figure 6:
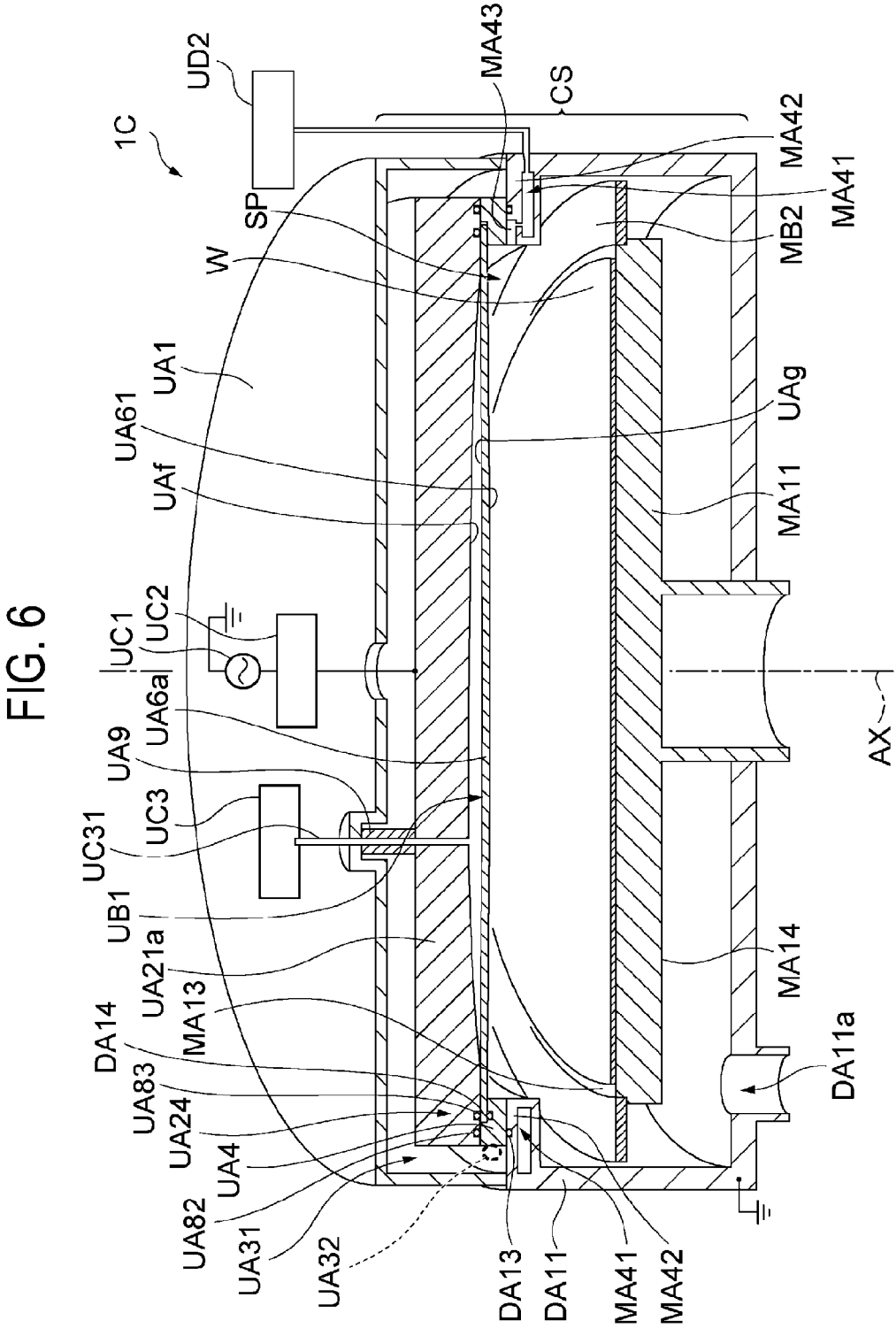
FIG. 6 is a view illustrating the configuration of a plasma processing apparatus according to another exemplary embodiment.

As another example, the shape of the lower surface UAf can be a wavy curved surface (an undulating curved surface), a stepped surface, or the like (which is applicable to the upper electrode UA21a illustrated in FIGS. 1, 2, and 6). In this case, the wavy shape of the lower surface UAf can be adjusted to a shape that can reduce the influence of harmonics caused by the non-linear current-voltage characteristics of the plasma sheath. The wavy shape of the lower surface UAf can be the shape of the lower surface UAf illustrated in FIG. 7 as a specific example. Further, the stepped shape of the lower surface UAf can be effective in order to avoid processing the lower surface UAf of the upper electrode UA21 into a curved surface.

Figure 7:
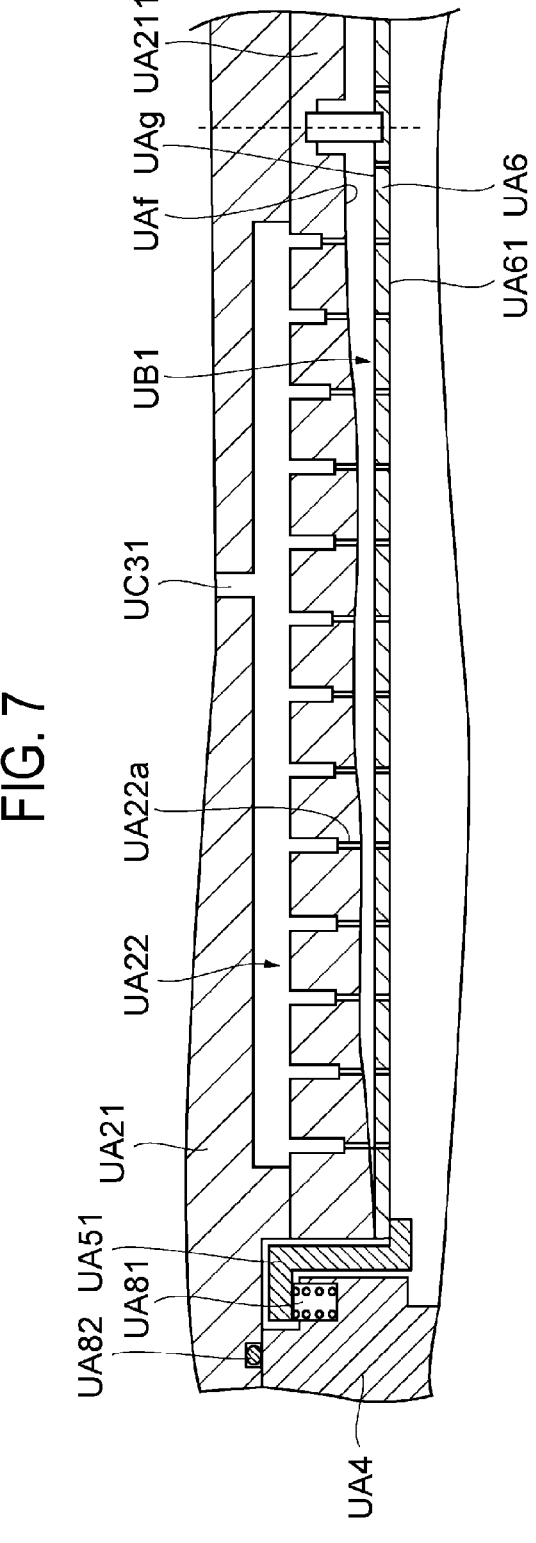
FIG. 7 is a view illustrating an example of the shape of the lower surface of an upper electrode illustrated in each of FIGS. 1, 2, and 6.

As illustrated in FIG. 7, the upper electrode UA21 may include a lower layer UA211. The lower layer UA211 includes the lower surface UAf of the upper electrode UA21. The lower layer UA211 can be attached to and detached from the upper electrode UA21 and can be prepared according to each of the shapes of a plurality of lower surfaces UAf. The suitable cross-sectional shape of the lower surface UAf may differ depending on the plasma excitation conditions, but it is costly to replace the entire upper electrode UA21 according to the plasma excitation conditions, and the labor required for replacement may increase. In this respect, since the lower layer UA211 having the lower surface UAf with a desired shape can be attached to the upper electrode UA21 according to the plasma excitation conditions, the cost and labor required for replacement can be reduced.

Figure 8:
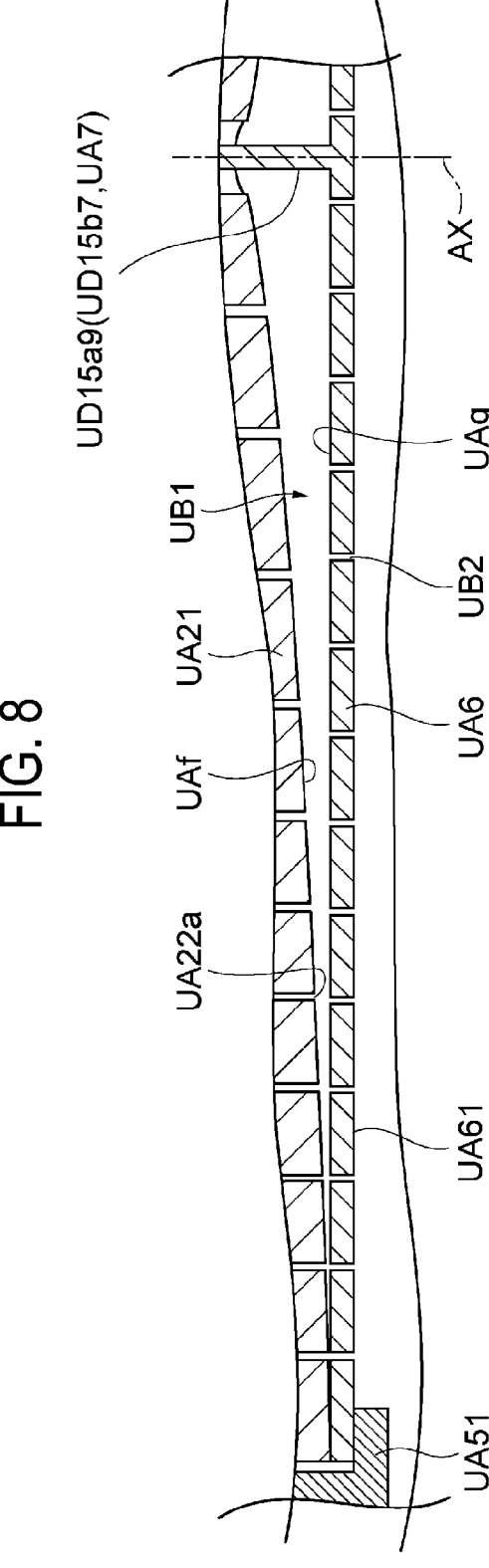
FIG. 8 is a view illustrating an example of the shape of an gap between the upper electrode and a dielectric plate.
Figure 9:
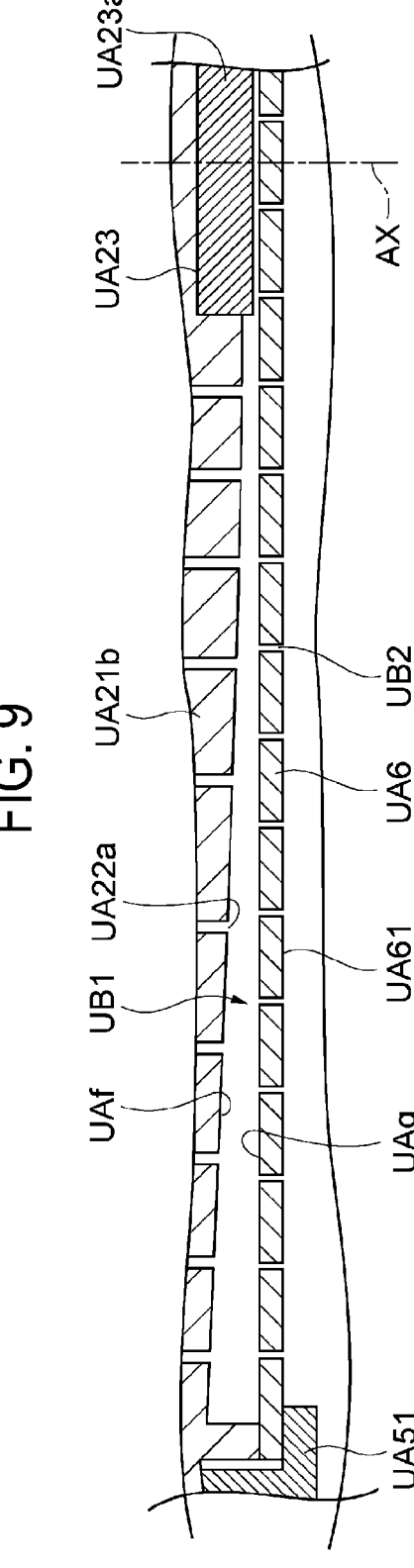
FIG. 9 is a view illustrating another example of the shape of the gap between the upper electrode and the dielectric plate.

Other specific examples of the shape of the gap UB1 are illustrated in FIGS. 8 and 9. The specific examples of the gap UB1 illustrated in FIGS. 8 and 9 can be applied to the respective gaps UB1 of the plasma processing apparatus 1A illustrated in FIG. 1 and the plasma processing apparatus 1C illustrated in FIG. 6.

The width of the gap UB1 illustrated in FIG. 8 increases from the end portion of each of the upper electrode UA21 and the dielectric plate UA6 toward the center portion (the portion intersecting the axial line AX). The width of the gap UB1 illustrated in FIG. 8 is the largest at the center portion of the upper electrode UA21 and the dielectric plate UA6.

The configurations illustrated in FIGS. 1, 2, 6 and 7 can be suitably used when the frequency of a surface wave (electromagnetic wave) is in the VHF band and ¼ of the wavelength of the surface wave is longer than the radius of the surface of the dielectric plate UA6 (a surface on the opposite side of the upper surface UAg). As described above, this surface wave is a electromagnetic wave propagating between the upper electrode UA21 and the plasma generated in the space SP at the time of plasma generation.

As described above, the width of the gap UB1 illustrated in FIG. 8 increases from the end portion of each of the upper electrode UA21 and the dielectric plate UA6 toward the center portion thereof (the portion intersecting the axial line AX). Therefore, the generation of a standing wave due to the surface wave is suppressed, thereby suppressing the increase (non-uniformity) of a high frequency voltage generated between the dielectric plate UA6 and the plasma generated in the space SP at the time of plasma generation.

Further, in another specific example of the gap UB1, the width of the gap UB1 (the distance between the lower surface UAf and the upper surface UAg) remains approximately constant in a first region from the end portion of the dielectric plate UA6 to the vicinity of the axial line AX and can increase in a second region in the vicinity of the axial line AX from a boundary with the first region toward the axial line AX. When the thickness of the gap UB1 is relatively large in the second region in this way, the propagation of the surface wave can be suppressed, thereby suppressing the concentration of the surface wave in the vicinity (center portion) of the axial line AX. Such an example of the gap UB1 can be applied to the gaps UB1 illustrated in FIGS. 1 and 6.

An gap UB1 illustrated in FIG. 9 is defined by using an upper electrode UA21b in place of the upper electrode UA21. The upper electrode UA21b is provided above the dielectric plate UA6.

In the upper electrode UA21b, an gap UA23 is provided in the center portion of the lower surface UAf where the axial line AX intersects, and the gap UA23 is filled with an insulator part UA23a. The upper electrode UA21b includes a plurality of gas discharge holes UA22a.

The material of the upper electrode UA21b can be the same as the material of the upper electrode UA21. The material of the insulator part UA23a can be an insulating material such as aluminum nitride or aluminum oxide. A corrosion-resistant film is formed on the surface of the upper electrode UA21b. The corrosion-resistant film can be an aluminum oxide film, an yttrium oxide film, or a ceramic film containing aluminum oxide, yttrium oxide, or the like.

The width of the gap UB1 illustrated in FIG. 9 decreases from the end portion of each of the upper electrode UA21b and the dielectric plate UA6 toward the center portion thereof (the portion intersecting the axial line AX). The width of the gap UB1 illustrated in FIG. 9 is the largest on the end portion side of the upper electrode UA21b and the dielectric plate UA6.

The gap UB1 illustrated in FIG. 9 can be suitably used when the frequency of the surface wave (electromagnetic wave) is in the VHF band to the UHF band and ¼ of the wavelength of the surface wave is shorter than the radius of the surface of the dielectric plate UA6 (the surface on the opposite side of the upper surface UAg).

As described above, the width of the gap UB1 illustrated in FIG. 9 decreases from the end portion of each of the upper electrode UA21b and the dielectric plate UA6 toward the center portion thereof (the portion intersecting the axial line AX). Therefore, the attenuation of the surface wave (electromagnetic wave) propagating between the dielectric plate UA6 and the plasma generated in the space SP at the time of plasma generation is suppressed.

Further, the width of the gap UB1 illustrated in FIG. 9 is the smallest at the center portion of the upper electrode UA21 and the dielectric plate UA6. Therefore, the decrease in potential generated between the dielectric plate UA6 and the plasma generated in the space SP at the time of plasma generation can be suppressed. Further, the insulator part UA23a can have a function of preventing concentration of the surface wave in the center portion and discharge in the gap UB1.

A determination on whether to use the shape of the gap UB1 illustrated in FIG. 8 or the shape of the gap UB1 illustrated in FIG. 9 can be made depending on the magnitude relationship between ¼ of the wavelength $\lambda$ of the surface wave and the radius L of the lower surface UA61 of the dielectric plate UA6 (the radius of a plasma excitation area). The lower surface UA61 having the radius L is a surface on the opposite side of the upper surface UAg and exposed in the space SP.

The wavelength $\lambda$ [cm] of the surface wave is approximately equal to a value (quotient) obtained by dividing a value, which is obtained by multiplying the square root of the electron density ne[cm$^{-3}$] in the vicinity of the lower surface UA61 in the space SP by 9.6, by the square of the plasma excitation frequency f [MHz]. In this case, as an example, the wavelength $\lambda$ [cm] is calculated using the electron temperature of 3 [eV], the electron density of $1 \times 10^{11}$ cm$^{-3}$, and the sheath width, which is 15 times as long as the Debye length, in the vicinity of the lower surface UA61 in the space SP When $\lambda/4 > L$, a standing wave of the surface wave having the axial line AX as an antinode is easy to occur and the surface wave is difficult to be attenuated. Therefore, the shape of the gap UB1 illustrated in FIG. 8 is suitable for $\lambda/4 > L$. When $\lambda/4 < L$, it is easy for the surface wave to be attenuated. Therefore, the shape of the gap UB1 illustrated in FIG. 9 is suitable for $\lambda/4 < L$.

Since the above-mentioned wavelength $\lambda$ [cm] is inversely proportional to the square of the plasma excitation frequency f [MHz], the influence of the plasma excitation frequency f [MHz] on the propagation of the surface wave is relatively large. Therefore, regardless of which of the shape of the gap UB1 illustrated in FIG. 8 and the shape of the gap UB1 illustrated in FIG. 9 is used, the distribution of plasma in the radial direction (a direction intersecting the axial line AX and in which the dielectric plate UA6 extends) can be adjusted by adjusting the wavelength $\lambda$ [cm]. In order to adjust the distribution of plasma in the radial direction, the plasma excitation frequency f [MHz] may be continuously changed, or a plurality of plasma excitation frequencies f [MHz] may be applied so that their power ratios can be changed.

Hereinafter, FIG. 10 will be mainly referred to. Each of the above-described plasma processing apparatus 1A and plasma processing apparatus 1C may include a stage MA111 in place of the stage MA11. The stage MA111 is provided in the process container CS.

The stage MA111 has a main body MA11a and a conductive layer MA15 like the stage MA11. The conductive layer MA15 is provided in the main body MA11a.

In one embodiment, the conductive layer MA15 can be a heater (resistive heating element). In this embodiment, the conductive layer MA15 can include, for example, a heater member MA15a and a heater member MA15b as in the case of the plasma processing apparatus 1A. The heater member MA15a is electrically connected to the heater power supply DB62a via the common mode filter DB61a. The heater member MA15b is electrically connected to the heater power supply DB62b via the common mode filter DB61b.

The stage MA111 further includes a conductive layer MA16. The conductive layer MA16 is provided in the main body MA11a. A DC power supply DB63 is electrically connected to the conductive layer MA16.

A distance between the conductive layer MA15 and the upper surface MA13 of the stage MA111 is larger than a distance between the conductive layer MA16 and the upper surface MA13 of the stage MA111. That is, the distance between the conductive layer MA16 and the upper surface MA13 of the stage MA111 is the shortest distance among the distances between a plurality of conductive layers of the stage MA111 and the upper surface MA13.

The conductive layer MA16 is formed in an annular region in the main body MA11a. The central axial line of this annular region substantially coincides with the axial line AX. The inner diameter of this annular region is, for example, ⅙ (50 [mm]) or more of the diameter of the substrate W. The outer diameter of this annular region is smaller than the diameter of the substrate W. The conductive layer MA16 may be formed in a mesh shape.

The conductive layer MA16 has the shortest distance from the upper surface MA13 of the stage MA111 among one or more conductive layers provided in the stage MA111. The conductive layer MA16 is any one of an electrode for generating an electrostatic attractive force between the stage MA111 and the substrate W placed on the stage MA111, an electrode to which a high frequency is supplied, and a grounded electrode. The conductive layer MA16 is formed in an annular shape.

The material of the main body MA11a can be an insulator (dielectric) such as aluminum nitride or aluminum oxide. The material of the conductive layer MA16 can be metal such as tungsten or molybdenum.

Figure 11:
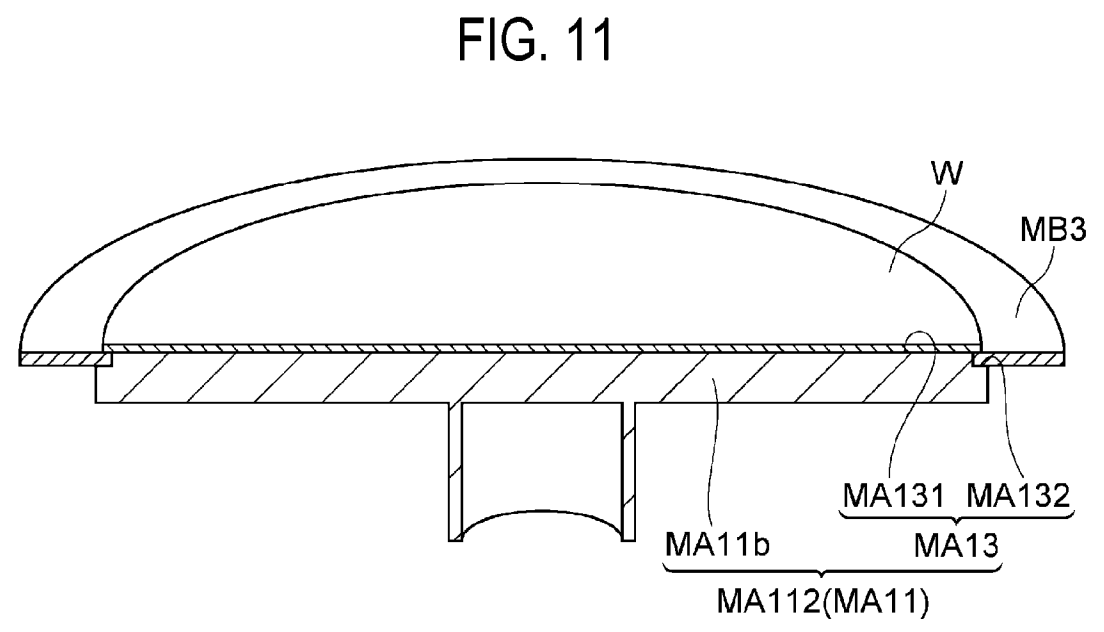

Hereinafter, FIG. 11 will be mainly referred to. The above-described plasma processing apparatus 1A can include a focus ring MB3 in place of the baffle member MB1, and a stage MA112 in place of the stage MA11. The above-described plasma processing apparatus 1C can include a focus ring MB3 in place of the plasma shielding plate MB2, and a stage MA112 in place of the stage MA11.

The stage MA112 is provided in the process container CS. The stage MA112 has a main body MA11b.

The material of the stage MA112 can be metal such as aluminum or an aluminum alloy. The stage MA112 can have substantially a disk shape. The central axial line of the stage MA112 substantially coincides with the axial line AX.

The focus ring MB3 is provided on the upper surface MA13 of the stage MA112. The focus ring MB3 extends along the periphery of the upper surface MA13. The inner diameter of the focus ring MB3 is smaller than the diameter of the upper surface MA13 of the stage MA112.

The upper surface MA13 of the stage MA112 includes a substrate mounting region MA131 and a focus ring mounting region MA132. The substrate mounting region MA131 is substantially a circular region. The substrate W is mounted on the substrate mounting region MA131. The diameter of the substrate mounting region MA131 is smaller than the diameter of the substrate W.

The focus ring mounting region MA132 extends in the radial direction outside the substrate mounting region MA131. The position of the focus ring mounting region MA132 in the vertical direction is lower than the position of the substrate mounting region MA131 in the vertical direction.

The focus ring MB3 is mounted on the focus ring mounting region MA132. The focus ring MB3 has substantially an annular shape and has a plate shape.

The material of the focus ring MB3 can be aluminum oxide, quartz, or the like. The focus ring MB3 is mounted on the focus ring mounting region MA132 so that the upper surface of the inner edge thereof faces the lower surface of the edge of the substrate W.

With the stage MA112, the focus ring MB3 suppresses the generation of a high frequency electric field between the center portion and the outer peripheral portion of the stage MA112.

According to the plurality of above-described exemplary embodiments, the gap UB1 is provided between the upper electrode UA21/the upper electrode UA21a/the upper electrode UA21b and the plasma (the dielectric plate UA6/the dielectric plate UA6a provided above the plasma) generated in the space SP at the time of plasma generation. In the case of the high frequency of the VHF band or the UHF band, the uniformity of plasma in the direction in which the lower surface UA61 of the dielectric plate UA6/the dielectric plate UA6a extends can be reduced by the generation of the standing wave. However, the generation of the standing wave is suppressed by the presence of the gap UB1, so that the gradient of the electric field in the vicinity of the upper electrode UA21/the upper electrode UA21a/the upper electrode UA21b (more specifically, the dielectric plate UA6/the dielectric plate UA6a) in the space SP can be reduced. Therefore, the uniformity of plasma can be improved.

Further, the width of the gap UB1 (the distance between the lower surface UAf and the upper surface UAg) may be non-uniform in the direction in which the dielectric plate UA6/the dielectric plate UA6a extends (the direction in which the gap UB1 extends). That is, the width of the gap UB1 can be adjusted so that the generation of the standing wave is suppressed.

In particular, when the high frequency of the VHF band or the UHF band is radiated into the space SP, the width of the gap UB1 can be adjusted. By this adjustment, the wavelength of the surface wave (electromagnetic wave) propagating between the upper electrode UA21/the upper electrode UA21a/the upper electrode UA21b (more specifically, the dielectric plate UA6/the dielectric plate UA6a) and the plasma generated in the space SP at the time of plasma generation can be suitably extended. Therefore, the uniformity of plasma can be further improved.

Further, the gap UB1 can be more stably defined by the dielectric rod UA7/the dielectric rod UD15a9/the dielectric rod UD15b7.

Further, even if each part thermally expands due to heat input from the plasma or the like, since the end portion of the dielectric plate UA6 and the end portion of the upper electrode UA21 are connected to each other by pressing via the elastic member UA81 or the like, problems such as cracking of the dielectric plate UA6 can be prevented.

Further, when the width of the gap UB1 increases from the end portion of each of the upper electrode UA21/the upper electrode UA21a and the dielectric plate UA6/the dielectric plate UA6a toward the center portion thereof, the generation of the standing wave by the surface wave can be prevented.

Further, when the width of the gap UB1 decreases from the end portion of each of the upper electrode UA21/the upper electrode UA21a/the upper electrode UA21b and the dielectric plate UA6/the dielectric plate UA6a toward the center portion thereof, the attenuation of the surface wave can be suppressed.

Further, when the lower surface UAf of each of the upper electrode UA21 and the upper electrode UA21a exposed to the gap UB1 has a wavy shape, the influence of harmonics generated by the non-linear current-voltage characteristics of the plasma sheath can be reduced.

Further, as each of the dielectric rod UD15a9 and the dielectric rod UD15b7 moves, the width of the gap UB1 can be finely adjusted.

Further, since the dielectric plate UA6 is a shower plate, a gas can be supplied into the space SP from the lower surface UA61 of the dielectric plate UA6.

Further, some of the plurality of gas discharge holes UA22a and some of the plurality of gas discharge holes UB2 are provided to overlap each other. Therefore, a flow of gas from the upper electrode UA21/the upper electrode UA21b and the dielectric plate UA6 into the space SP can be good.

Figure 10:
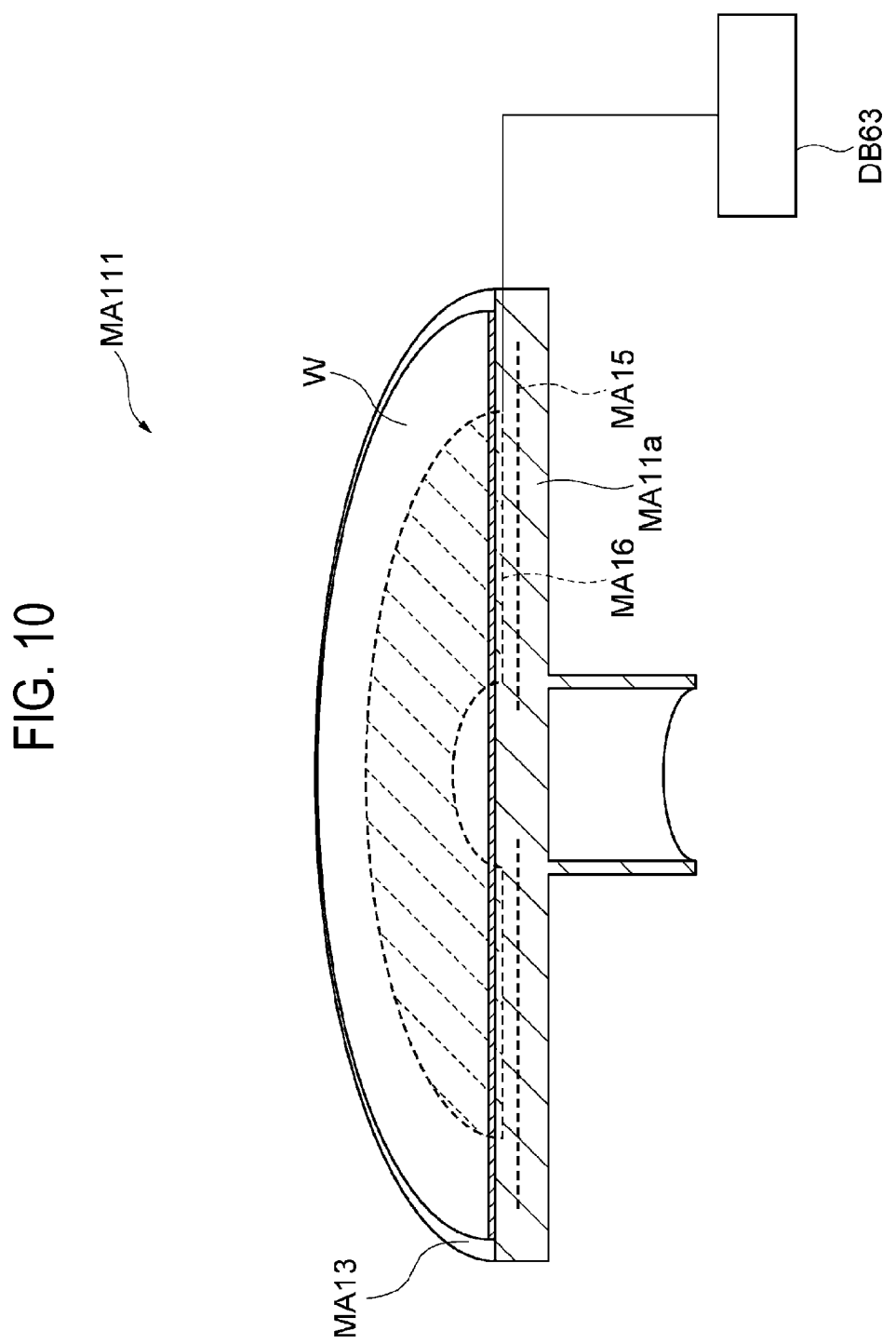
FIG. 10 is a view illustrating a stage according to another exemplary embodiment.

Further, as illustrated in FIG. 10, among one or more conductive layers (the conductive layer MA15, the conductive layer MA16, etc.) provided in the stage MA111, the conductive layer MA16 having the shortest distance from the upper surface MA13 of the stage MA111 is formed in an annular shape. Therefore, the high frequency bias that is unevenly applied to the substrate W placed on the stage MA111 can be suppressed.

A plasma processing method using the plasma processing apparatuses 1A to 1C will be described. In this method, plasma processing is performed in a state where the width of the gap UB1 provided between the upper electrode UA21 or the upper electrode UA21a and the dielectric plate UA6 or the dielectric plate UA6a is non-uniform in the direction in which the dielectric plate UA6 or the dielectric plate UA6a extends.

Although various exemplary embodiments have been described above, various omissions, substitutions, and changes may be made without being limited to the above-described exemplary embodiments. It is also possible to combine elements from different exemplary embodiments to form other exemplary embodiments.

From the above description, it is to be understood that various exemplary embodiments of the present disclosure are described herein for purposes of description and that various modifications can be made without departing from the scope and spirit of the present disclosure. Therefore, the various exemplary embodiments disclosed herein are not intended to be limiting, and the true scope and spirit thereof are set forth by the appended claims.

EXPLANATION OF REFERENCE NUMERALS

1A: plasma processing apparatus, 1B: plasma processing apparatus, 1C: plasma processing apparatus, AX: axis line, CS: process container, DA10: elastic member, DA11: side wall, DA11a: exhaust port, DA12: projection, DA13: sealing member, DA14: elastic member, DA2: inlet/outlet, DB11: support part, DB12: exhaust pipe, DB21: bellows, DB22: bellows, DB3: spring, DB4: water-cooled plate, DB61a: common mode filter, DB61b: common mode filter, DB62a: heater power supply, DB62b: heater power supply, DB63: DC power supply, MA11: stage, MA111: stage, MA112: stage, MA11a: main body, MA11b: main body, MA12: outer peripheral portion, MA13: upper surface, MA131: substrate mounting region, MA132: focus ring mounting region, MA14: back surface, MA15: conductive layer, MA15a: heater member, MA15b: heater member, MA16: conductive layer, MA21: conductive part, MA22: conductive plate, MA23: conductive elastic member, MA31: exhaust chamber, MA32: wall part, MA33: vent hole, MA41: gas chamber, MA42: wall part, MA43: gas discharge groove, MB1: baffle member, MB2: plasma shielding plate, MB3: focus ring, SP: space, UA1: waveguide wall, UA21: upper electrode, UA211: lower layer, UA21a: upper electrode, UA21b: upper electrode, UA22: cavity, UA22a: gas discharge hole, UA23: air gap, UA23a: insulator part, UA24: outer peripheral portion, UA31: waveguide, UA32: end portion, UA4: insulating member, UA51: support ring, UA52: cover ring, UA6: dielectric plate, UA6a: dielectric plate, UA61: lower surface, UA7: dielectric rod, UA81: elastic member, UA82: sealing member, UA83: sealing member, UA9: tube, UAf: lower surface, UAg: upper surface, UB1: air gap, UB2: gas discharge hole, UC1: high frequency supply, UC2: matching device, UC3: gas supply part, UC31: gas pipe, UD10: drive mechanism, UD11: motor, UD12: insulating shaft, UD13: pulley, UD14: belt, UD15a: driving part, UD15a1: pulley, UD15a2: adjusting screw, UD15a3: container, UD15a4: shaft, UD15a5: spring, UD15a6: O-ring, UD15a7: female portion, UD15a8: male portion, UD15a9: dielectric rod, UD15b: driving part, UD15b1: pulley, UD15b2: adjusting screw, UD15b3: container, UD15b4: ball, UD15b5: shaft, UD15b6: bellows, UD15b7: dielectric rod, UD2: gas supplier

What is claimed is:

1. A plasma processing apparatus comprising:
a process container;
a stage provided in the process container;
a dielectric plate provided above the stage via a space in the process container;
an upper electrode provided above the dielectric plate;
a waveguide that guides a high frequency of a VHF band or an UHF band;
an end portion of the waveguide that is located toward the space and radiates the high frequency into the space; and
a dielectric rod interposed between the upper electrode and the dielectric plate and extending along a central axial line of the process container,
wherein a gap is provided between the upper electrode and the dielectric plate,
wherein a width of the gap is non-uniform in a direction in which the dielectric plate extends, and
wherein the gap is defined by separating the upper electrode and the dielectric plate from each other in a state where the end portion of the upper electrode and the end portion of the dielectric plate are in close contact with each other.

2. The plasma processing apparatus of claim 1, wherein an end portion of the dielectric plate and an end portion of the upper electrode are connected to each other by pressing by an elastic member.

3. The plasma processing apparatus of claim 1, wherein the width of the gap increases from the end portion of each of the upper electrode and the dielectric plate toward a center portion thereof.

4. The plasma processing apparatus of claim 1, wherein the width of the gap decreases from the end portion of each of the upper electrode and the dielectric plate toward a center portion thereof.

5. The plasma processing apparatus of claim 1, wherein a lower surface of the upper electrode exposed in the gap has a wavy shape.

6. The plasma processing apparatus of claim 1, further comprising: a drive mechanism that moves the dielectric rod in a reference direction intersecting a lower surface of the upper electrode exposed to the gap, wherein the dielectric rod is connected to or joined to the dielectric plate, or is integrated with the dielectric plate.

7. The plasma processing apparatus of claim 6, wherein the drive mechanism drives the dielectric rod in the reference direction to increase/decrease the width of the gap.

8. The plasma processing apparatus of claim 7, wherein the drive mechanism comprises:

a motor, a first pulley, an insulating shaft, a belt, and a driving part, wherein the motor is provided on the upper electrode, wherein the first pulley, the belt, and the driving part are provided in the upper electrode, wherein the insulating shaft is connected to the motor, wherein the first pulley connects the insulating shaft and the belt, wherein the driving part connects the dielectric rod and the belt and drives the dielectric rod in the reference direction by using power of the motor transmitted via the insulating shaft and the belt, wherein the driving part includes a second pulley and a shaft, wherein the second pulley connects the belt and the shaft, and wherein the shaft is connected to the dielectric rod via a floating joint.

9. The plasma processing apparatus of claim 6, wherein the drive mechanism moves the dielectric rod along the reference direction so as to separate the upper electrode and the dielectric plate from each other, so that the width of the gap increases.

10. The plasma processing apparatus of claim 9, wherein the drive mechanism comprises:

a motor, a first pulley, an insulating shaft, a belt, and a driving part, wherein the motor is provided on the upper electrode, wherein the first pulley, the belt, and the driving part are provided in the upper electrode, wherein the insulating shaft is connected to the motor, wherein the first pulley connects the insulating shaft and the belt, wherein the driving part connects the dielectric rod and the belt and drives the dielectric rod in the reference direction by using power of the motor transmitted via the insulating shaft and the belt, wherein the driving part includes a second pulley and a shaft, wherein the second pulley connects the belt and the shaft, and wherein the shaft is connected to the dielectric rod.

11. The plasma processing apparatus of claim 1, wherein the dielectric plate is a shower plate.

12. The plasma processing apparatus of claim 11, wherein the upper electrode has a plurality of first gas discharge holes, wherein the dielectric plate has a plurality of second gas discharge holes, wherein the plurality of first gas discharge holes and the plurality of second gas discharge holes communicate with each other through the gap, and wherein at least some of the plurality of first gas discharge holes and at least some of the plurality of second gas discharge holes are provided so as to overlap each other.

13. The plasma processing apparatus of claim 1, wherein the gap communicates with a gas pipe connected to an external gas supply part.

14. The plasma processing apparatus of claim 1, wherein the stage comprises:

a main body formed of an insulator; and a conductive layer provided in the main body, wherein the conductive layer has a shortest distance from an upper surface of the stage among one or more conductive layers provided in the stage and is formed in an annular shape.

15. The plasma processing apparatus of claim 14, wherein the conductive layer has an outer diameter smaller than a diameter of a substrate placed on the stage.

16. The plasma processing apparatus of claim 14, wherein the conductive layer is any one of an electrode for generating an electrostatic attractive force between the stage and a substrate placed on the stage, an electrode to which a high frequency is supplied, and a grounded electrode.

17. The plasma processing apparatus of claim 14, wherein the conductive layer is formed in a mesh shape.

* * * * *